(12) United States Patent
Ogura et al.

(10) Patent No.: US 6,310,393 B1
(45) Date of Patent: Oct. 30, 2001

(54) ELECTRIC CIRCUIT AND PACKAGE FOR SEMICONDUCTOR

(75) Inventors: Tetsuyosi Ogura, Settsu; Yukihiro Fukumoto, Kyotanabe; Hideki Iwaki, Ibaraki; Yutaka Taguchi, Takatsuki; Yoshihiro Bessho, Higashi Osaka, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/412,593

(22) Filed: Oct. 5, 1999

(30) Foreign Application Priority Data

Oct. 9, 1998 (JP) .................................................. 10-288259

(51) Int. Cl.[7] .................................................. H01L 23/48
(52) U.S. Cl. .......................... 257/723; 257/531; 257/532
(58) Field of Search .................................. 257/531, 532, 257/723, 724; 438/107, 110

(56) References Cited

U.S. PATENT DOCUMENTS

| | | | |
|---|---|---|---|
| 5,027,089 | * | 6/1991 | Henke ..................................... 333/12 |
| 5,182,223 | * | 1/1993 | Ovens et al. ............................ 437/60 |
| 5,438,697 | * | 8/1995 | Fowler et al. ......................... 455/347 |
| 5,621,245 | * | 4/1997 | Agatstein et al. .................... 257/724 |
| 5,696,466 | * | 12/1997 | Li ......................................... 330/286 |
| 5,705,963 | * | 1/1998 | Ikeda et al. ........................... 257/531 |
| 5,717,249 | * | 2/1998 | Yoshikawa et al. .................. 257/728 |
| 6,020,636 | * | 1/2000 | Adishian ............................... 257/724 |

OTHER PUBLICATIONS

Yoshida, Shiro et al. "Printed Circuit Board (PCB) with Enhanced Decoupling Circuit containing Magnetic Material" *Technical Report of IEICE* (1997) pp. 1–8. (Abstract translated).

Yoshida, Shiro et al. "Novel decoupling circuit enabling notable electromagnetic noise suppression and high–density packaging in a digital printed circuit board" *IEEE EMC Symposium* (1998) pp. 641–646.

* cited by examiner

*Primary Examiner*—Eddie Lee
*Assistant Examiner*—Lourdes Cruz
(74) *Attorney, Agent, or Firm*—Smith, Gambrell & Russell, LLP

(57) ABSTRACT

The semiconductor package of this invention includes: a semiconductor element having a power supply terminal, a ground terminal, and an output terminal; an inductance; and a capacitance. One of opposing terminals of the capacitance is connected to the power supply terminal of the semiconductor element, and the other terminal is connected to the ground terminal of the semiconductor element. The ground terminal of the semiconductor element is connected to a ground terminal of the semiconductor package, the power supply terminal of the semiconductor element is connected to a power supply terminal of the semiconductor package via the inductance, and the output terminal of the semiconductor element is connected to an output terminal of the semiconductor package.

18 Claims, 26 Drawing Sheets

ELECTRIC CIRCUIT AND PACKAGE FOR SEMICONDUCTOR

BACKGROUND OF THE INVENTION

1. Field of the Invention

The present invention relates to an electric circuit and a semiconductor package capable of eliminating source noise in a semiconductor integrated circuit which performs high-speed operation.

2. Description of the Related Art

The current used in a semiconductor integrated circuit tends to increase by many times as the bus width of a semiconductor system increases from 8 bits to 16 bits, from 16 bits to 32 bits, and from 32 bits to 64 bits. Also, as the speed of the semiconductor system increases, the current change interval is shortened by several times, from 10 nsec. to several nsec. and to less than 1 nsec. As a result, recently, the change rate of the current consumed by a semiconductor device (dI/dt) has increased by several tens of times. With such an increasing current change rate, source noise tends to increase.

When an inductance exists between a ground terminal of a power supply for a semiconductor device and the power supply, voltage variation is generated in proportion to current change. This develops to source noise and becomes a cause of malfunction of the semiconductor device. In order to prevent this problem, a bypass capacitor is conventionally provided near power supply/ground terminals of a semiconductor device. This reduces the source impedance as observed from the semiconductor device and thus reduces source noise. However, in a construction where a plurality of semiconductor devices and bypass capacitors are arranged, a current flows from one semiconductor device, not only to the corresponding bypass capacitor near the semiconductor device, but also to another bypass capacitor.

FIG. 28 shows a circuit diagram showing a current flowing to a semiconductor circuit.

Referring to FIG. 28, the reference numerals 35a and 35b denote semiconductor devices, 36 denotes an output terminal, 37a and 37b denote bypass capacitors, 38 denotes a signal line, 39 denotes a normal current flowing to the semiconductor device 35a, and 40 denotes an undesirable current which may cause a variation in source potential. The current 40 generates source noise for the other semiconductor device 35b and becomes a cause of electromagnetic radiation from power supply/ground planes.

In order to reduce the above phenomena, TECHNICAL REPORT OF IEICE, EMCJ97-82, for example, describes a method which uses a substrate capable of reliably decoupling adjacent semiconductor devices mounted thereon from each other. FIG. 29 illustrates this method.

Referring to FIG. 29, the reference numeral 35 denotes semiconductor devices, 36 denotes an output terminal, 37 denotes bypass capacitors, 38 denotes a signal line, 41 denotes decoupling coils, 42 denotes a power supply plane, and 43 denotes a ground plane.

The decoupling coil 41 is inserted between the power supply terminal of each semiconductor device 35 and the power supply plane 42. One terminal of the bypass capacitor 37 is connected with the power supply terminal of the semiconductor device 35, and the other terminal thereof is grounded. In this way, a high-frequency current flowing to the semiconductor device 35 is supplied from the bypass capacitor 37 disposed near the semiconductor device 35 without flowing to the power supply plane 42.

The reason for the above is that, by the insertion of the decoupling coil 41, an impedance $Zc=1/(j\omega C)$ on the side of the bypass capacitor 37 as observed from the semiconductor device 35 becomes lower than an impedance $Ze=j\omega L$ on the side of the power supply as observed from the semiconductor device 35.

The larger the ratio of the impedance Ze on the side of the power supply as observed from the semiconductor device 35 to the impedance Zc on the side of the bypass capacitor 37 as observed from the semiconductor device 35 is, the greater the effects of attenuating source noise for other semiconductor devices and electromagnetic radiation from the power supply/ground planes are.

With the above conventional construction, however, if the decoupling coil 41 is large, the impedance also increases at a low frequency, resulting in failure to supply a current required for the semiconductor device 35 from the power supply. In order to avoid this problem, it is required that the decoupling coil 41 be sufficiently small and that the bypass capacitor 37 be sufficiently close to the semiconductor device 35 for reducing parasitic inductance.

If the decoupling coil 41 and the bypass capacitor 37 are constructed as discrete elements, there arise problems such that elements with appropriate values are not obtainable and that the impedance Zc cannot be sufficiently made small due to parasitic inductance possessed by the bypass capacitor 37. As a result, sufficient effects of attenuating source noise and electromagnetic radiation from the power supply/ground planes are not obtained.

Construction of discrete elements has other disadvantages as follows. The cost increases. The area required for implementation of these elements increases and thus reduction in size of the resultant device becomes difficult. With an increased size of the device, high-speed operation is not possible.

In a high-speed operating circuit, in general, each of the ground plane 43 and the power supply plane 42 is formed as an entire pattern on an inner layer of the substrate. The signal line 38 is formed so as to constitute a micro-strip line structure with the ground plane 43 formed on the first inner layer nearest to the signal line 38 among underlying inner layers of the substrate. Alternatively, the signal line 38 is formed so as to constitute a micro-strip line structure with the power supply plane 42 formed on the first inner layer among the underlying inner layers of the substrate as described above.

Herein, the former construction may also be referred to as the construction having the ground plane 43 right under the signal line 38, whereas the latter construction may also be referred to as the construction having the power supply plane 42 right under the signal line 38.

However, when the signal line 38 constitutes a micro-strip line structure with the power supply plane 42 in the construction shown in FIG. 29, the power supply plane 42 exists right under the signal line 38. In this case, a feedback current of a current flowing to the output terminal 36 flows to the power supply plane 42 via the decoupling coil 41. This increases the impedance and thus high-speed operation is not possible. For this reason, the construction shown in FIG. 29 can be fabricated only on a surface of a substrate right under which the ground plane 43 exists, but not on a surface thereof right under which the power supply plane 42 exists.

As a result, in a high-speed operating circuit, implementation may be limited, or a longer interconnection route may be required for implementation. Otherwise, implementation itself may be impossible. Further, for these reasons, the following disadvantages arise. The cost increases. The area required for implementation increases and thus reduction in size of the resultant device becomes difficult. With an increased size of the device, high-speed operation is not possible.

As described above, the conventional semiconductor integrated circuit aims at reducing source noise and electromagnetic radiation by decoupling semiconductor circuits from each other with respect to high frequency using decoupling coils. However, the semiconductor integrated circuit has problems such that implementation is limited, the cost increases, the source impedance increases due to increase of an impedance component, the area for implementation increases, and high-speed operation becomes difficult.

SUMMARY OF THE INVENTION

An object of the present invention is to solve the above problems inherent in the conventional semiconductor integrated circuit and provide small and inexpensive electric circuit and semiconductor package capable of reducing source noise and electromagnetic radiation.

The 1st invention of the present invention is an electric circuit comprising:

a semiconductor element having at least one power supply terminal and at least one ground terminal;

at least one inductance; and at least one capacitance, wherein one terminal of opposing terminals of the capacitance is connected to the power supply terminal and the other terminal is connected to the ground terminal, the power supply terminal is connected to a power supply, and the ground terminal is grounded via the inductance.

The 2nd invention of the present invention is a semiconductor package comprising: (1) a semiconductor element having at least one power supply terminal, at least one ground terminal, and at least one output terminal; (2) at least one inductance; and (3) at least one capacitance, wherein one terminal of opposing terminals of the capacitance is connected to the power supply terminal of the semiconductor element and the other terminal is connected to the ground terminal of the semiconductor element, the ground terminal of the semiconductor element is connected to a ground terminal of the semiconductor package, the power supply terminal of the semiconductor element is connected to a power supply terminal of the semiconductor package via the inductance, and the output terminal of the semiconductor element is connected to an output terminal of the semiconductor package.

The 3rd invention of the present invention is a semiconductor package comprising: (1) a semiconductor element having at least one power supply terminal, at least one ground terminal, and at least one output terminal; (2) at least one inductance; and (3) at least one capacitance, wherein one terminal of opposing terminals of the capacitance is connected to the power supply terminal of the semiconductor element and the other terminal is connected to the ground terminal of the semiconductor element, the power supply terminal of the semiconductor element is connected to a power supply terminal of the semiconductor package, the ground terminal of the semiconductor element is connected to a ground terminal of the semiconductor package via the inductance, and the output terminal of the semiconductor element is connected to an output terminal of the semiconductor package.

The 4th invention of the present invention is a semiconductor package comprising: (1) a semiconductor element having at least one power supply terminal, at least one ground terminal, and at least one output terminal; (2) at least two inductances; and (3) at least one capacitance, wherein one terminal of opposing terminals of the capacitance is connected to the power supply terminal of the semiconductor element and the other terminal is connected to the ground terminal of the semiconductor element, the ground terminal of the semiconductor element is connected to a first ground terminal of the semiconductor package, the power supply terminal of the semiconductor element is connected to a first power supply terminal of the semiconductor package, the ground terminal of the semiconductor element is connected to a second ground terminal of the semiconductor package via the first inductance of the at least two inductances, the power supply terminal of the semiconductor element is connected to a second power supply terminal of the semiconductor package via the second inductance of the at least two inductances, and the output terminal of the semiconductor element is connected to an output terminal of the semiconductor package.

The 5th invention of the present invention is a semiconductor package comprising: (1) a semiconductor element having at least one power supply terminal, at least one ground terminal, and at least one pair of differential output terminals; (2) at least two inductances; and (3) at least one capacitance, wherein one terminal of opposing terminals of the capacitance is connected to the power supply terminal of the semiconductor element and the other terminal is connected to the ground terminal of the semiconductor element, the ground terminal of the semiconductor element is connected to a ground terminal of the semiconductor package via the first inductance of the at least two inductances, the power supply terminal of the semiconductor element is connected to a power supply terminal of the semiconductor package via the second inductance of the at least two inductances, and the pair of differential output terminals of the semiconductor element are connected to a pair of differential output terminals of the semiconductor package.

The 6th invention of the present invention is an electric circuit comprising:

(1) a semiconductor element having at least one power supply terminal, at least one ground terminal, and at least one pair of differential output terminals;

at least two inductances; and at least one capacitance, wherein one terminal of opposing terminals of the capacitance is connected to the power supply terminal of the semiconductor element and the other terminal is connected to the ground terminal of the semiconductor element, the ground terminal of the semiconductor element is grounded via the first inductance of the at least two inductances, the power supply terminal of the semiconductor element is connected to a power supply via the second inductance of the at least two inductances, and the pair of differential output terminals of the semiconductor element are connected to a pair of terminals.

The 7th invention of the present invention is an implemented structure comprising:

a semiconductor package according to said the 2nd invention; and a substrate on which the semiconductor package is mounted, the substrate having a ground plane formed on an inner layer, wherein a signal line is connected to the output terminal of the semiconductor element, and the ground plane is formed on the first inner layer under the signal line.

The 8th invention of the present invention is an implemented structure comprising:

a semiconductor package according to said the 3rd invention and a substrate on which the semiconductor package is mounted, the substrate having a power supply plane formed on an inner layer, wherein a signal line is connected to the output terminal of the semiconductor element, and the power supply plane is formed on the first inner layer under the signal line.

The 9th invention of the present invention is an implemented structure comprising:

a semiconductor package according to said the 4th invention; and a substrate on which the semiconductor package is mounted, the substrate having a ground plane and a power supply plane formed on respective inner layers, wherein a signal line is connected to the output terminal of the semiconductor element, the ground plane is formed on the first inner layer of the inner layers under the signal line, the first ground terminal is connected to the ground plane, and the second power supply terminal is connected to the power supply plane.

The 10th invention of the present invention is an implemented structure comprising:

a semiconductor package according to said the 4th invention; and a substrate on which the semiconductor package is mounted, the substrate having a ground plane and a power supply plane formed on respective inner layers, wherein a signal line is connected to the output terminal of the semiconductor element, the power supply plane is formed on the first inner layer of the inner layers under the signal line, the first power supply terminal is connected to the power supply plane, and the second ground terminal is connected to the ground plane.

The 11th invention of the present invention is an implemented structure comprising:

a semiconductor package according to the 5th invention; and a substrate on which the semiconductor package is mounted, the substrate having a power supply, a ground terminal, and differential signal terminals, wherein the power supply terminal of the semiconductor package is connected to the power supply of the substrate, the ground terminal of the semiconductor package is connected to the ground terminal of the substrate, and the pair of differential output terminals of the semiconductor package are connected to the differential signal terminals.

The 12th invention of the present invention is a semiconductor package according to any of said the 2nd to 5th inventing, wherein the capacitance is a chip capacitor.

The 13th invention of the present invention is a semiconductor package according to any of said the 2nd to 5th inventions, wherein the capacitance is a thick film or thin film capacitor formed on an inner layer or a surface layer of a substrate of the semiconductor package.

The 14th invention of the present invention is a semiconductor package according to any of said the 2nd to 5th inventions, wherein the inductance is an inductor formed of an interconnect of the semiconductor package.

The 15th invention of the present invention is a semiconductor package according to any of said the 2nd to 5th inventions, wherein the inductance is a chip inductor.

The 16th invention of the present invention is a semiconductor package according to any of said the 2nd to 5th inventions, further comprising a carrier substrate on which the semiconductor element, the capacitance, and the inductance are to be mounted, wherein the carrier substrate is a ceramic substrate or a resin multi-layer substrate.

The 17th invention of the present invention is a semiconductor package according to any of said the 2nd to 5th inventions, wherein at least one terminal selected from the power supply terminal and the ground terminal of the semiconductor package is adjacent to the output terminal or the differential output terminals.

DESCRIPTION OF THE REFERENCE NUMERALS

Figure 1:
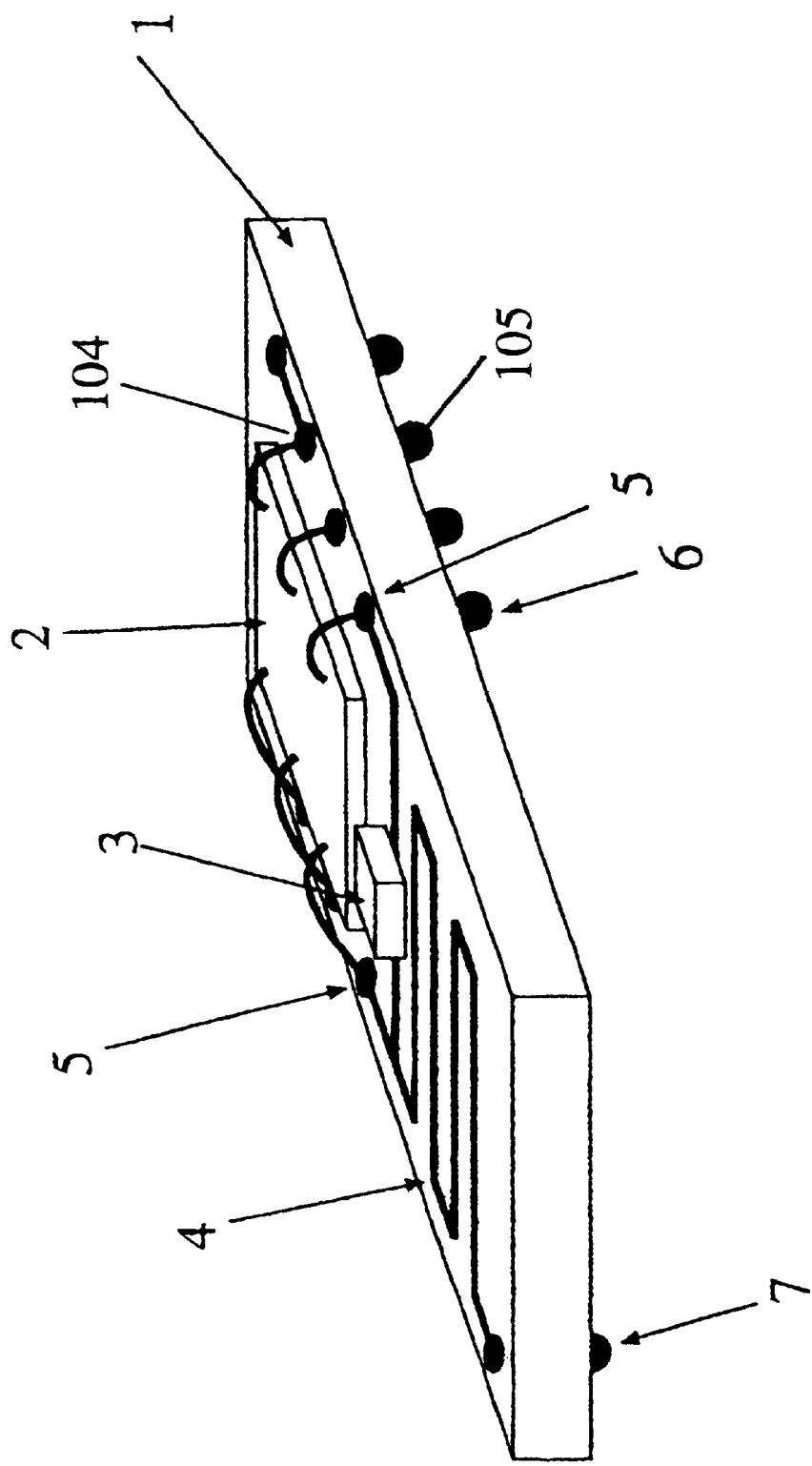
FIG. 1 is a view illustrating a structure of a semiconductor package of Embodiment 1 of the present invention.

1 . . . Semiconductor package
2 . . . Semiconductor element
3 . . . Capacitor
4 . . . Power supply (Vcc) side inductor
5 . . . Terminals disposed on the semiconductor package for connecting the semiconductor element 2 to the package
6 . . . Terminal disposed on the package for connecting one of the terminals 5 to the ground
7 . . . Terminal disposed on the semiconductor package 1 for connecting the power supply (Vcc) side inductor 4 to the power supply (Vcc)
8 . . . Line for connecting the terminal 6 to the ground
9 . . . Line for connecting the terminal 7 to the power supply (Vcc)
10 . . . Parasitic inductance existing between the semiconductor element 2 and the capacitor 3
11 . . . Power supply
12 . . . Inner resistance of the power supply 11
13 . . . Transmitter-side semiconductor package
14 . . . Receiver-side semiconductor package
15 . . . Transmitter-side semiconductor element
16 . . . Receiver-side semiconductor element
17 . . . Ground-side inductor
18 . . . Power supply (Vcc) side inductor
19 . . . Terminals disposed on the semiconductor package for connecting the transmitter-side semiconductor element 15 to the package
20 . . . Terminal disposed on the package for connecting one of the terminals 19 to the ground
21 . . . Terminal disposed on the package for connecting the other terminal 19 to the power supply (Vcc)
22 . . . Terminal disposed on the package for connecting the ground-side inductor 17 to the ground
23 . . . Terminal disposed on the package for connecting the power supply (Vcc) side inductor 18 to the power supply (Vcc)
24 . . . Terminal disposed on the semiconductor package for connecting the output terminal of the transmitter-side semiconductor element 15 to the package
25 . . . Terminal disposed on the package for connecting the terminal 24 to the substrate
26 . . . Line for connecting the terminal 22 to the ground
27 . . . Line for connecting the terminal 20 to the ground
28 . . . Line for connecting the terminal 23 to the power supply (Vcc)
29 . . . Line for connecting the terminal 21 to the power supply (Vcc)
30 . . . Ground plane
31 . . . Power supply (Vcc) plane
32 . . . Signal line
33 . . . Current loop
34 . . . Parasitic inductance existing between the transmitter-side semiconductor element 15 and the capacitor 3
35 . . . Semiconductor device
36 . . . Output terminal
37 . . . Bypass capacitor
38 . . . Signal line
39 . . . Current flowing to the semiconductor device 35
40 . . . Current flowing to the semiconductor device 35
41 . . . Decoupling coil
42 . . . Power supply plane
43 . . . Ground plane

DESCRIPTION OF THE PREFERRED EMBODIMENTS

Hereinbelow, embodiments of the present invention will be described with reference to the drawings.

(Embodiment 1)

Figure 2:
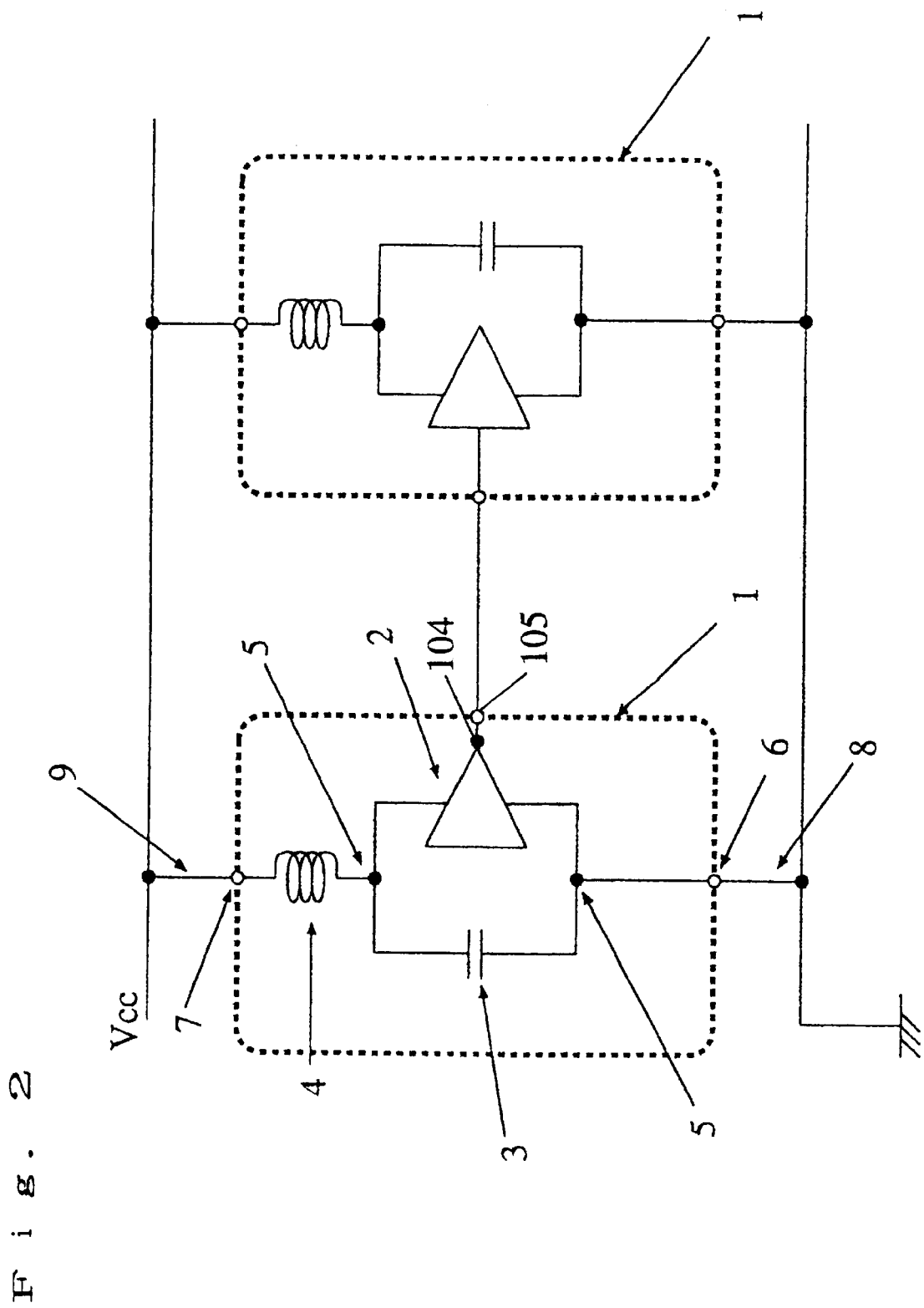
FIG. 2 is a view showing a circuit using the semiconductor package of Embodiment 1 of the present invention.

FIG. 1 is a perspective view of an exemplified structure of a semiconductor package of Embodiment 1 of the present invention. FIG. 2 shows a circuit diagram of a substrate with the semiconductor package of Embodiment 1 of the present invention mounted thereon.

Referring to FIGS. 1 and 2, the reference numeral 1 denotes a semiconductor package of Embodiment 1, 2 denotes a semiconductor element, 3 denotes a capacitor, 4 denotes a power supply (Vcc) side inductor, 5 denotes terminals disposed on the semiconductor package 1 for connecting the semiconductor element 2 to the semiconductor package 1, 6 denotes a terminal disposed on the semiconductor package 1 for connecting one of the terminals 5 to the ground, 7 denotes a terminal disposed on the semiconductor package 1 for connecting the power supply (Vcc) side inductor 4 to the power supply (Vcc), 8 denotes a line for connecting the terminal 6 to the ground, and 9 denotes a line for connecting the terminal 7 to the power supply (Vcc) The reference numeral 104 denotes a terminal disposed on the semiconductor package 1 for connecting the output terminal of the semiconductor element 2 to the package 1, 105 denotes a terminal disposed on the package 1 for connecting the terminal 104 to the substrate for implementation.

Figure 3:
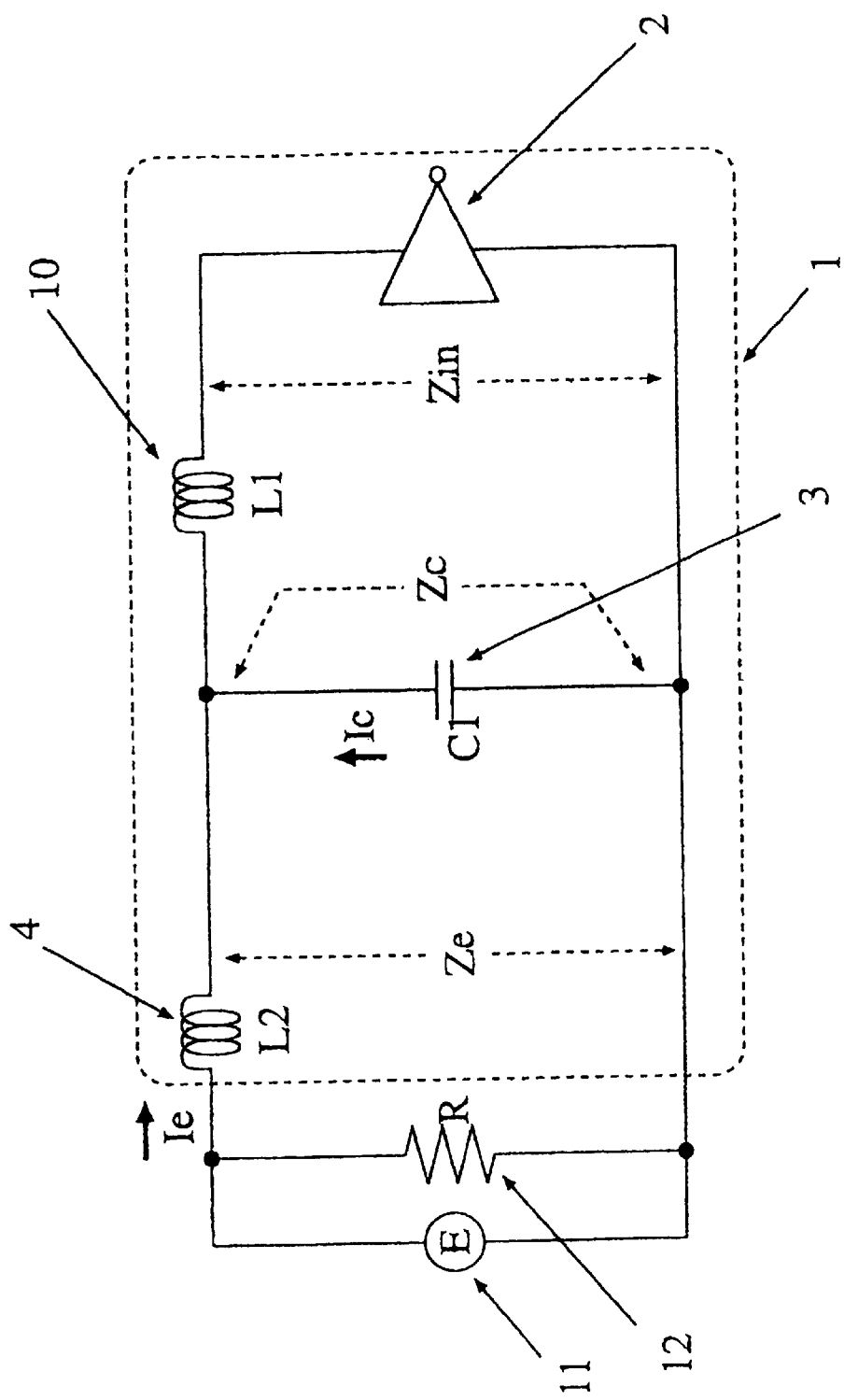
FIG. 3 is a view showing an equivalent circuit corresponding to a semiconductor element 2 and the vicinity thereof in Embodiment 1 of the present invention.

FIG. 3 shows an equivalent circuit corresponding to the semiconductor element 2 and the vicinity thereof.

Referring to FIG. 3, the reference numeral 1 denotes the semiconductor package, 2 denotes the semiconductor element, 3 denotes the capacitor, 4 denotes the power supply (Vcc) side inductor, 10 denotes a parasitic inductance existing between the semiconductor element 2 and the capacitor 3, 11 denotes the power supply, and 12 denotes an internal resistance of the power supply 11.

Referring to the equivalent circuit, the impedance Ze on the side of the power supply 11 as observed from both terminals of the capacitor 3 is expressed by $Ze=R+j\omega L_2$ wherein $\omega$ denotes the frequency. An impedance Zc of the capacitor 3 is expressed by $Zc=1/j\omega C_1$. Assuming that $C_1=1000$ pF, $L_1=3$ nH, $L_2=30$ nH, $R=1\Omega$, and the frequency is 100 MHz, for example, $Ze=1+18.85j$ and $Zc=-1.59j$, indicating that an current Ie flowing from the power supply 11 is about one-eleventh of a current Ic flowing to the capacitor 3.

As a result, a high-frequency current flowing to the semiconductor element 2 hardly flows out from the semiconductor package 1, and thus a circuit capable of reducing source noise and electromagnetic radiation is realized. Further, at this time, an impedance Zin on the side of the power supply as observed from the semiconductor element 2 is expressed by $Zin=j\omega L_1+ZeZc/(Ze+Zc)=0.008+0.147j$, which is small enough to allow the semiconductor element 2 to operate.

Figure 4:
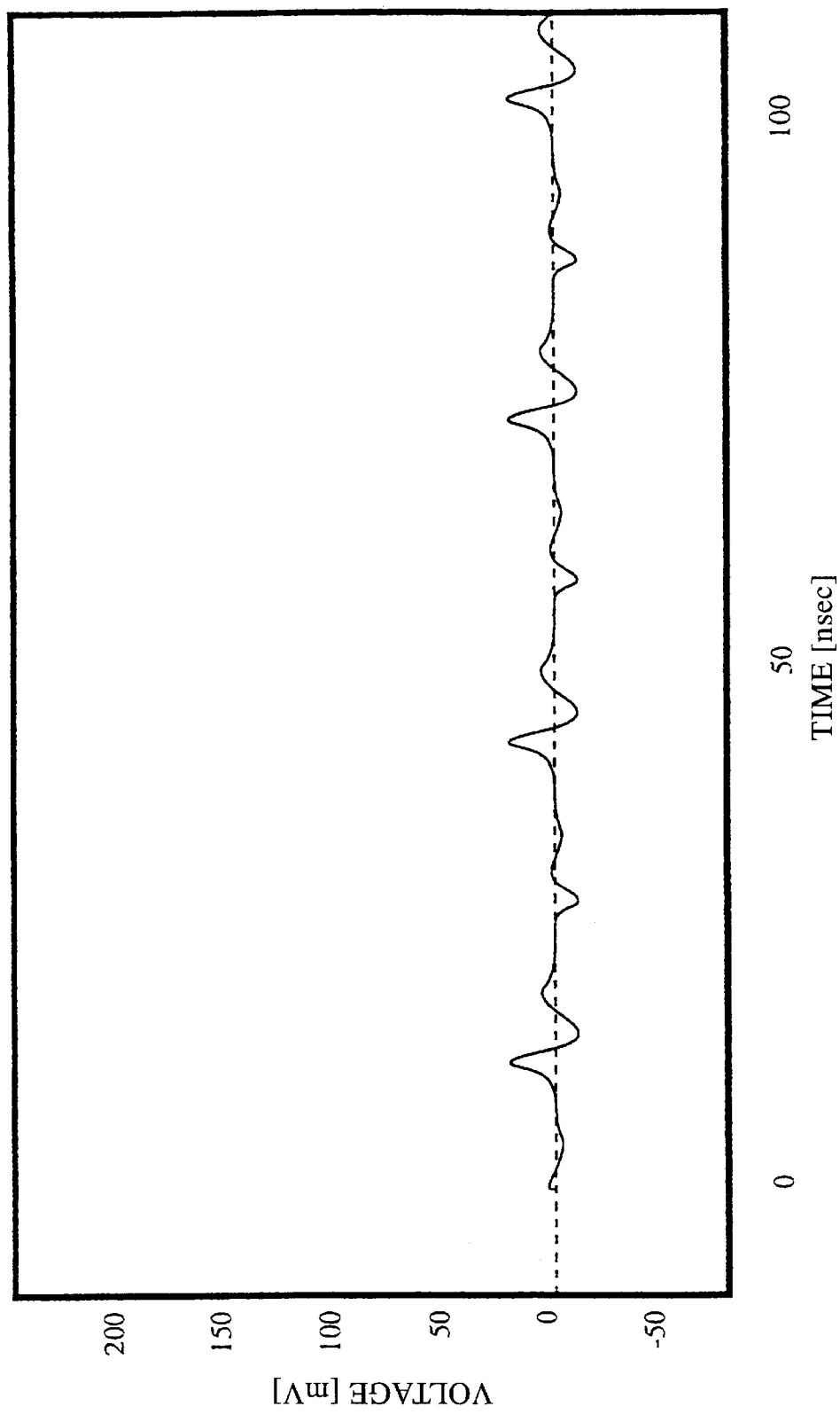
FIG. 4 is a view showing the measurement results of source noise in Embodiment 1 of the present invention.
Figure 5:
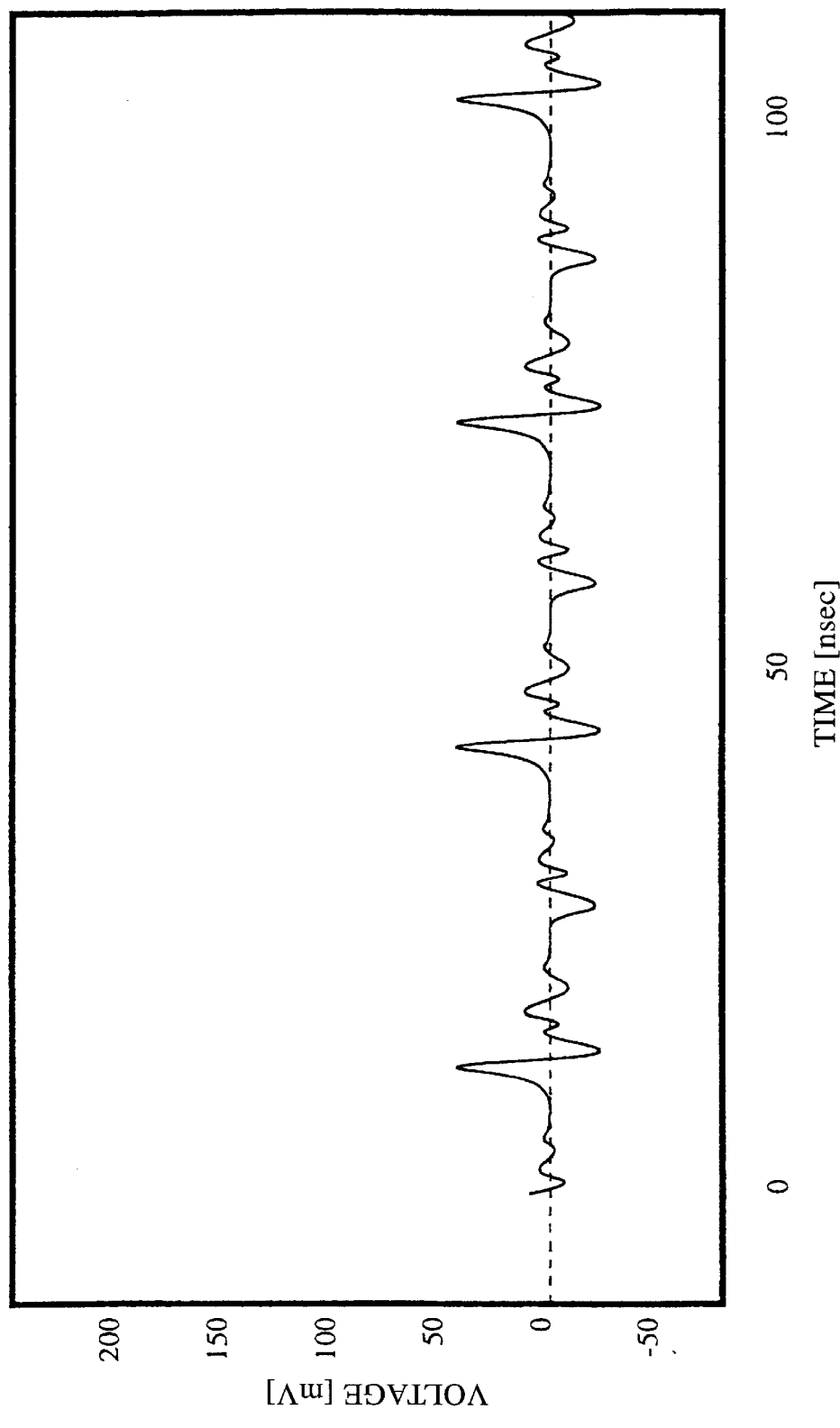
FIG. 5 is a view showing the measurement results of source noise in a comparative example where an inductor 4 does not exist in Embodiment 1 of the present invention.

The semiconductor package having the circuit configuration shown in FIG. 2 was actually fabricated and implemented on a substrate, which was then driven at 33 MHz to measure source noise. FIG. 4 shows the results of this measurement of source noise. FIG. 5 shows the results of measurement of source noise in a comparative example where the inductor 4 does not exist.

As is observed from these figures, the source noise was about 30 mV for the circuit configuration of this embodiment, which was about a half the value for the circuit configuration without the inductor 4. This indicates that the circuit configuration of this embodiment has a great effect of reducing source noise.

Figure 6:
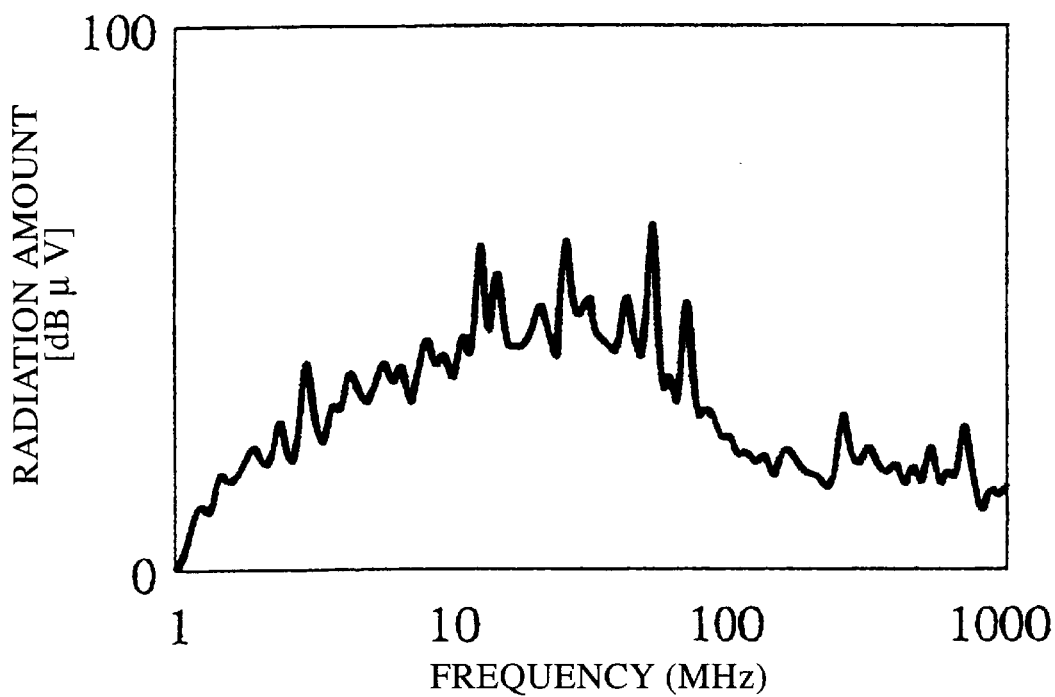
FIG. 6 is a view showing the measurement results of electromagnetic radiation in Embodiment 1 of the present invention.
Figure 7:
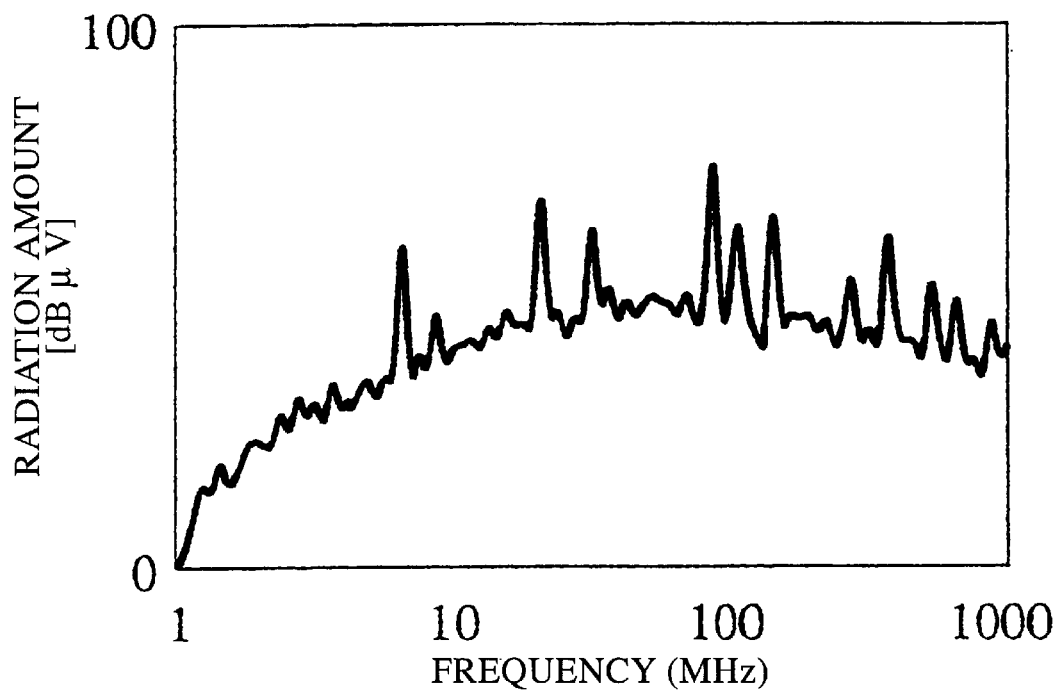
FIG. 7 is a view showing the measurement results of electromagnetic radiation in a conventional case.

Likewise, the results of measurement of electromagnetic radiation are shown in FIGS. 6 and 7. FIG. 6 shows the measurement results of electromagnetic radiation for the semiconductor package of this embodiment, whereas FIG. 7 shows the measurement results of electromagnetic radiation for a conventional semiconductor package.

It has been found from the above results that the semiconductor package having the circuit configuration shown in FIG. 2 can reduce electromagnetic radiation especially in the high-frequency range.

As described above, a circuit capable of reducing source noise and electromagnetic radiation can be provided by using the semiconductor package having the circuit configuration shown in FIG. 2.

Furthermore, by mounting the inductor 4 and the capacitor 3 on the semiconductor package, it is possible to reduce the parasitic inductance 10 existing between the semiconductor element 2 and the capacitor 3, and thus reduce the first term of the equation, $Zin=j\omega L_1+ZeZc/(Ze+Zc)$.

By reducing the first term, it is possible to comparatively increase the second term of the above equation, $ZeZc/(Ze+Zc)$, i.e., increase $ZeZc/(Ze+Zc)=(Zc/Ze)/(1+Zc/Ze)$. In other words, Zc/Ze can be made large, indicating that a larger effect of reducing source noise and electromagnetic radiation is obtained.

When the capacitance is provided outside the semiconductor package, the parasitic inductance 10 may sometimes be as large as ten and several nH depending on the construction and structure. Therefore, if $L_1=15$ nH, for example, $|Zin|=7.69\Omega$.

On the contrary, when the semiconductor package having the circuit configuration shown in FIG. 2 is used, since $L_1=3$ nH as described above, $|Zin|=0.147\Omega$, indicating that larger effect of reducing electromagnetic radiation can be expected.

Figure 8:
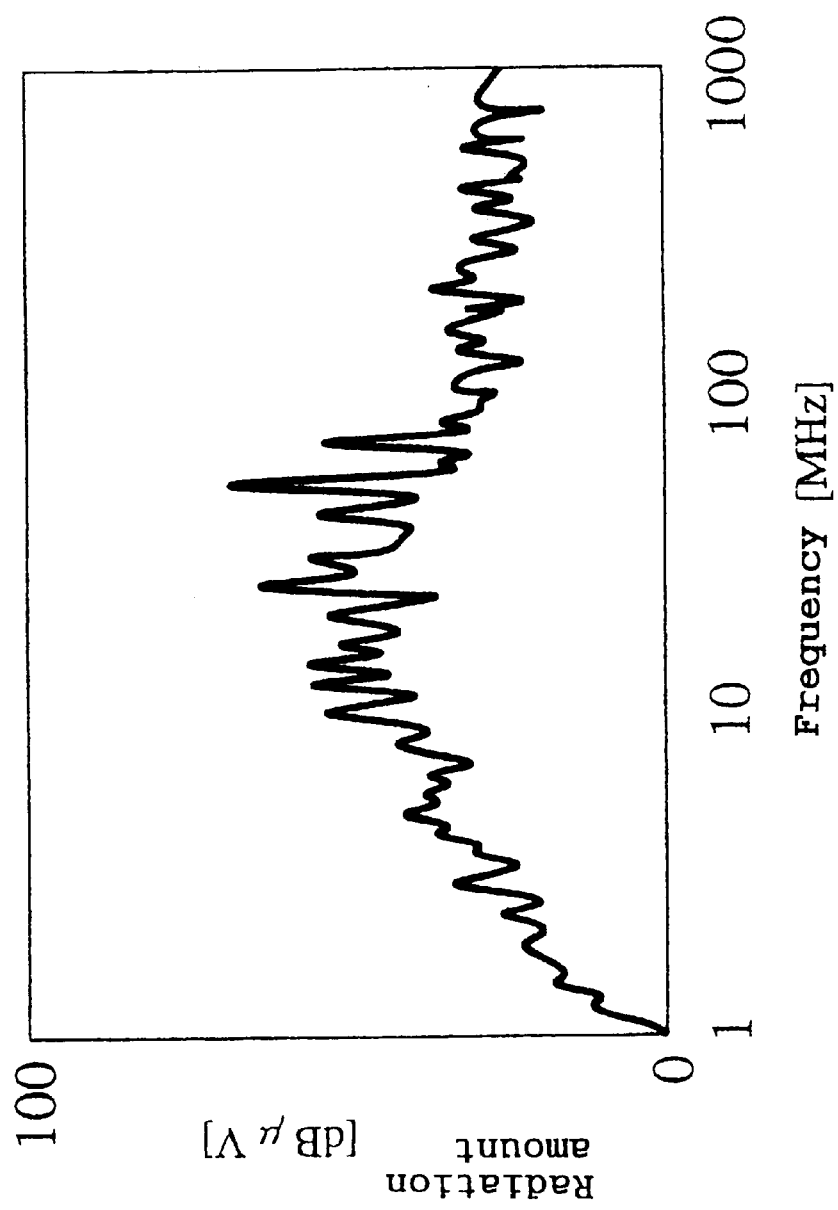
FIG. 8 is a view showing the measurement results of electromagnetic radiation in a comparative example where a capacitor 3 is disposed outside the semiconductor package in Embodiment 1 of the present invention.

FIG. 8 shows the measurement results of electromagnetic radiation obtained by actually disposing the capacitor 3 outside the semiconductor package as a comparative example. As is evident by comparing FIG. 8 with FIG. 6, the construction of having the capacitance inside the semiconductor package provides a larger effect of reducing electromagnetic radiation in the high-frequency range of about 100 MHz or more.

The capacitor 3 and the inductor 4 can be in any form as long as they function electrically as a capacitor and an inductor. For example, they may be in a form of a chip capacitor and a chip inductor, or may be an inductor formed on the semiconductor package 1 using an interconnect and a capacitor formed by disposing a conductor layer and an electrode inside the semiconductor package 1. In such cases, evidently, substantially the same effect is obtained.

In this embodiment, only the case of inserting the inductor 4 on the side of the power supply (Vcc) was considered. It is evident that substantially the same effect is obtained by arranging so that the ground terminal be connected to the ground via an inductor.

Only the power supply (Vcc) and the ground were considered in this embodiment. It is evident, however, that in a semiconductor element which requires a plurality of supply voltages such as voltages obtained from a positive power supply and a negative power supply, also, substantially the same effect as that described above is obtained by arranging so that the power supplies be connected via an inductor.

It is evident that substantially the same effect is obtained by providing the terminals 5, 6, and 7 and the lines 8 and 9 in plural numbers for each element.

Thus, as described above, the semiconductor package of Embodiment 1 is inexpensive since it is presented as a single package. Only a small area is necessary for implementation of the semiconductor package since no element is required outside the package, facilitating reduction of the size of the resultant device. It is also evident that the capabilities such as reduction of the device size, reduction of the parasitic inductance, and reduction of source noise and electromagnetic radiation are advantageous in realizing a high-speed circuit.

(Embodiment 2)

Figure 9:
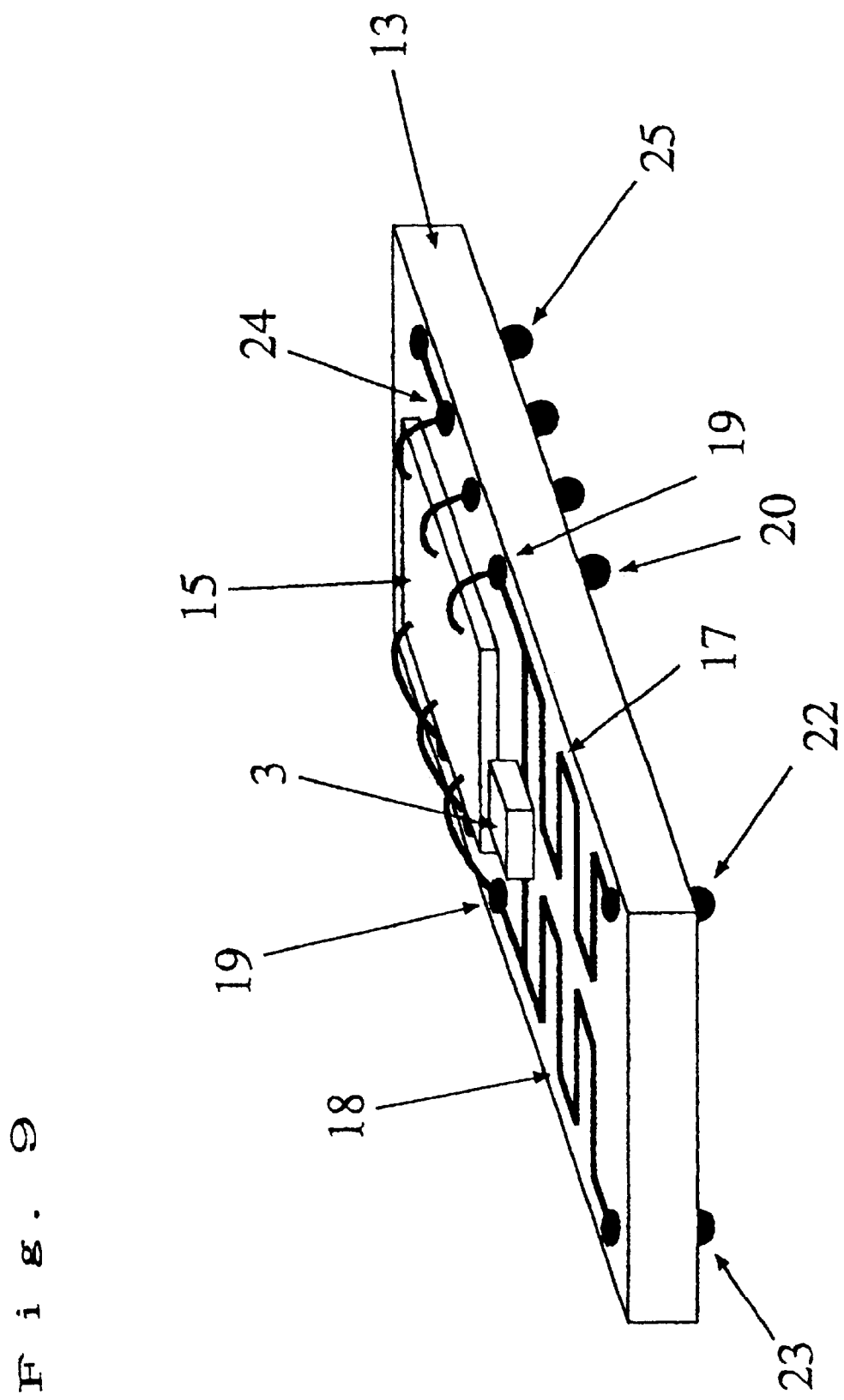
FIG. 9 is a view illustrating a structure of a semiconductor package of Embodiment 2 of the present invention.
Figure 10:
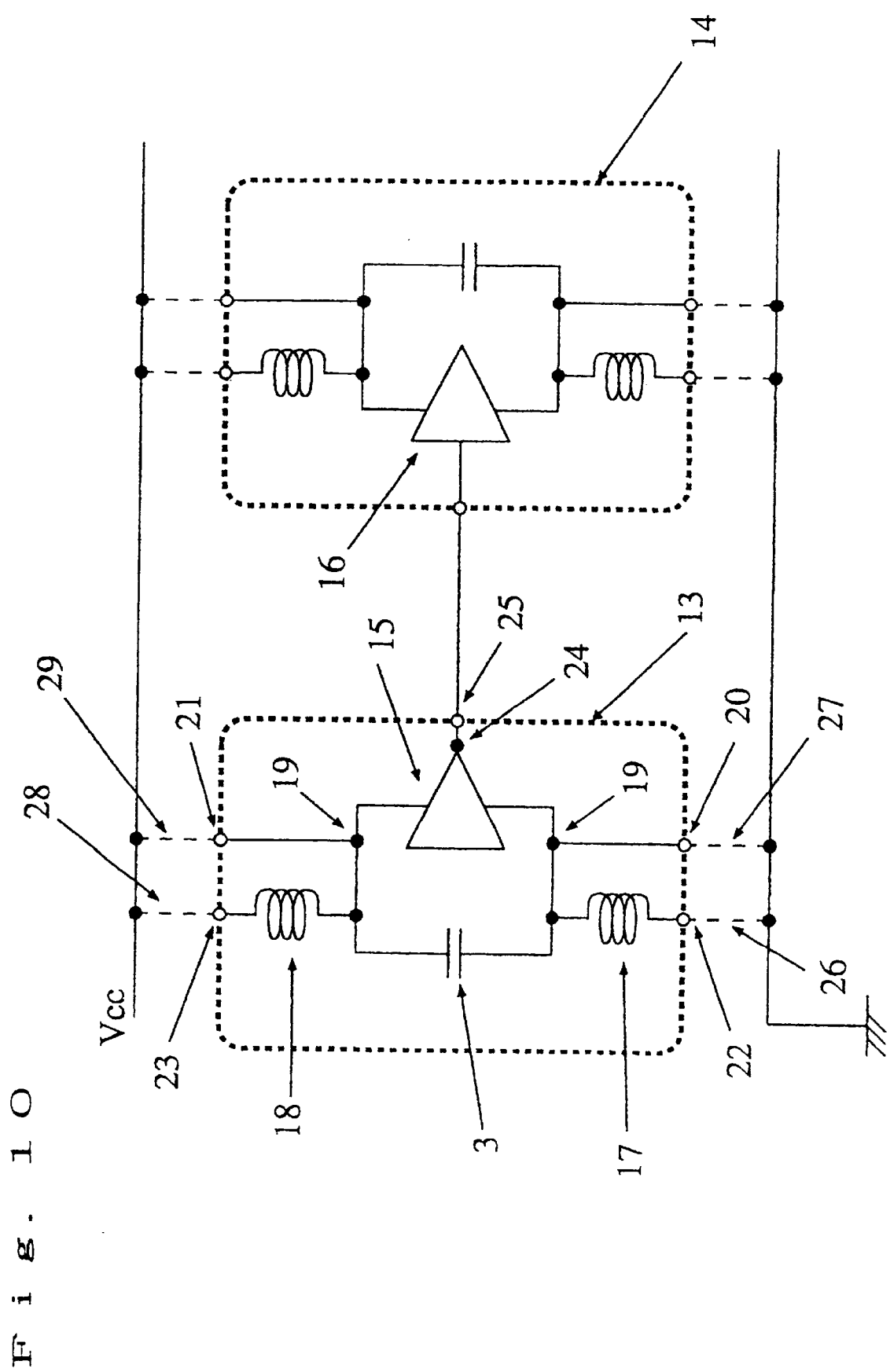
FIG. 10 is a view showing a circuit using the semiconductor package of Embodiment 2 of the present invention.

FIG. 9 is a perspective view of an exemplified structure of a semiconductor package of Embodiment 2 of the present invention. FIG. 10 shows a circuit diagram of a substrate with the semiconductor package of Embodiment 2 of the present invention mounted thereon.

Referring to FIGS. 9 and 10, the reference numeral 13 denotes a transmitter-side semiconductor package of Embodiment 2, and 14 denotes a receiver-side semiconductor package of Embodiment 2. The reference numeral 15 denotes a transmitter-side semiconductor element and 16 denotes a receiver-side semiconductor element. The reference numeral 3 denotes a capacitor, 17 denotes a ground-side inductor, and 18 denotes a power supply (Vcc) side inductor.

The reference numeral 19 denotes terminals disposed on the transmitter-side semiconductor package 13 for connecting the transmitter-side semiconductor element 15 to the package 13, and 20 denotes a terminal disposed on the package 13 for connecting one of the terminals 19 to the ground. The reference numeral 21 denotes a terminal disposed on the semiconductor package 13 for connecting the other terminal 19 to the power supply (Vcc). Herein, the first power supply terminal of the semiconductor package according to the present invention corresponds to the terminal 21, where as the first ground terminal of the semiconductor package according to the present invention corresponds to the terminal 20.

The reference numeral 22 denotes a terminal disposed on the package for connecting the ground-side inductor 17 to the ground, and 23 denotes a terminal disposed on the package for connecting the power supply (Vcc) side inductor 18 to the power supply (Vcc). The reference numeral 24 denotes a terminal disposed on the semiconductor package for connecting the output terminal of the transmitter-side semiconductor element 15 to the package, and 25 denotes a terminal disposed on the package for connecting the terminal 24 to the substrate. Herein, the second power supply terminal of the semiconductor package according to the present invention corresponds to the terminal 23, whereas the second ground terminal of the semiconductor package according to the present invention corresponds to the terminal 22.

The reference numeral 26 denotes a line for connecting the terminal 22 to the ground, and 27 denotes a line for connecting the terminal 20 to the ground. The reference numeral 28 denotes a line for connecting the terminal 23 to the power supply (Vcc), and 29 denotes a line for connecting the terminal 21 to the power supply (Vcc).

In this embodiment, when the semiconductor packages 13 and 14 are mounted on a substrate 801, the terminals to be used are selected depending on the direction in which a feedback current flows, toward the ground or the power supply.

Figure 11:
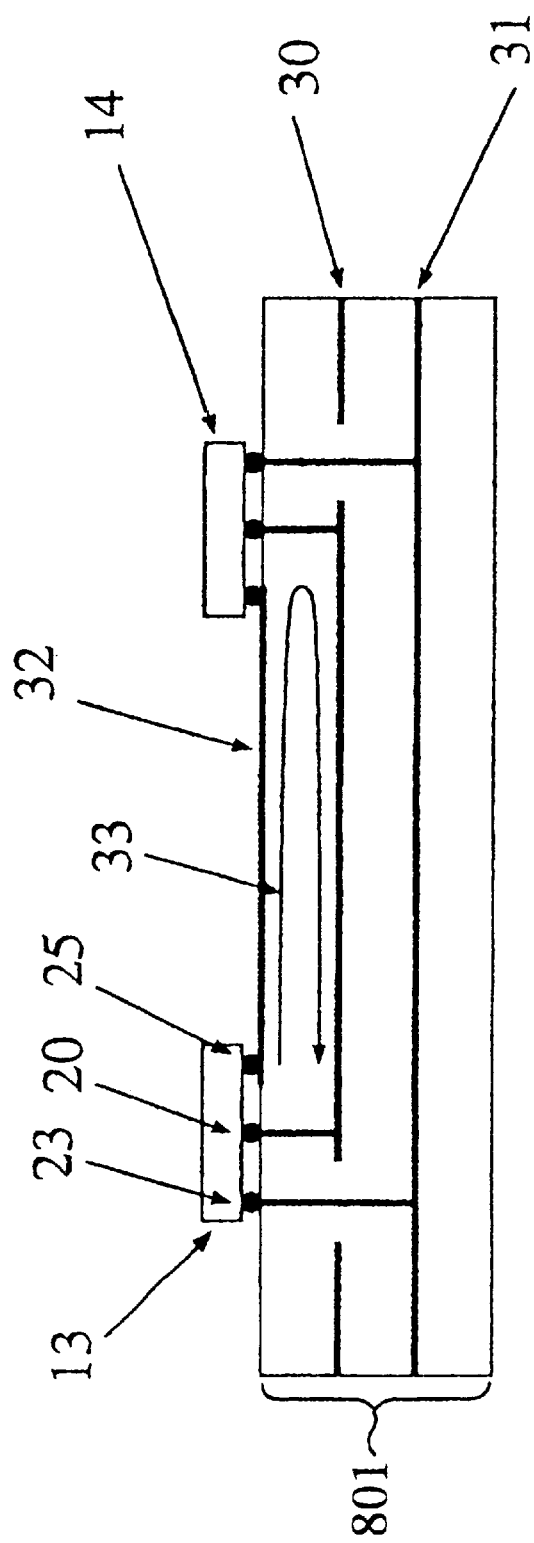
FIG. 11 is a cross-sectional view of an implementation of Embodiment 2 of the present invention.

FIG. 11 is a cross-sectional view of an implemented structure where the semiconductor package 13 is mounted on the ground side of the substrate 801.

In this figure, the same components as those shown in FIG. 10 are denoted by the same reference numerals. The reference numeral 30 denotes a ground plane, and 31 denotes a power supply (Vcc) plane. The reference numeral 32 denotes a signal line, and 33 denotes a current loop.

As shown in FIG. 11, the ground plane 30 is an entire pattern formed on the first inner layer located under the signal line 32 among those formed on inner layers inside the substrate.

In the construction shown in this figure, therefore, the terminals 20 and 23 are selected for connection among the terminals 20 to 24 of the semiconductor package 13.

Referring to FIG. 11, when the semiconductor elements 15 and 16 are mounted right above the ground plane 30, a feedback current of a current flowing to the signal line 32 flows through the ground plane 30. Therefore, the current loop 33 passes through the signal line 32 and the ground plane 30 as shown in FIG. 11.

Therefore, in the circuit shown in FIG. 10, by connecting the terminal 20 to the ground via the line 27 and connecting the terminal 23 to the power supply (Vcc) via the line 28 as described above, the impedance of the current loop 33 is lowered while the impedance between the power supply and the ground as observed from the semiconductor package 13 is increased. In this way, an unnecessary high-frequency current is prevented from flowing to the ground plane 30 and the power supply (Vcc) plane 31 in the substrate.

Figure 12:
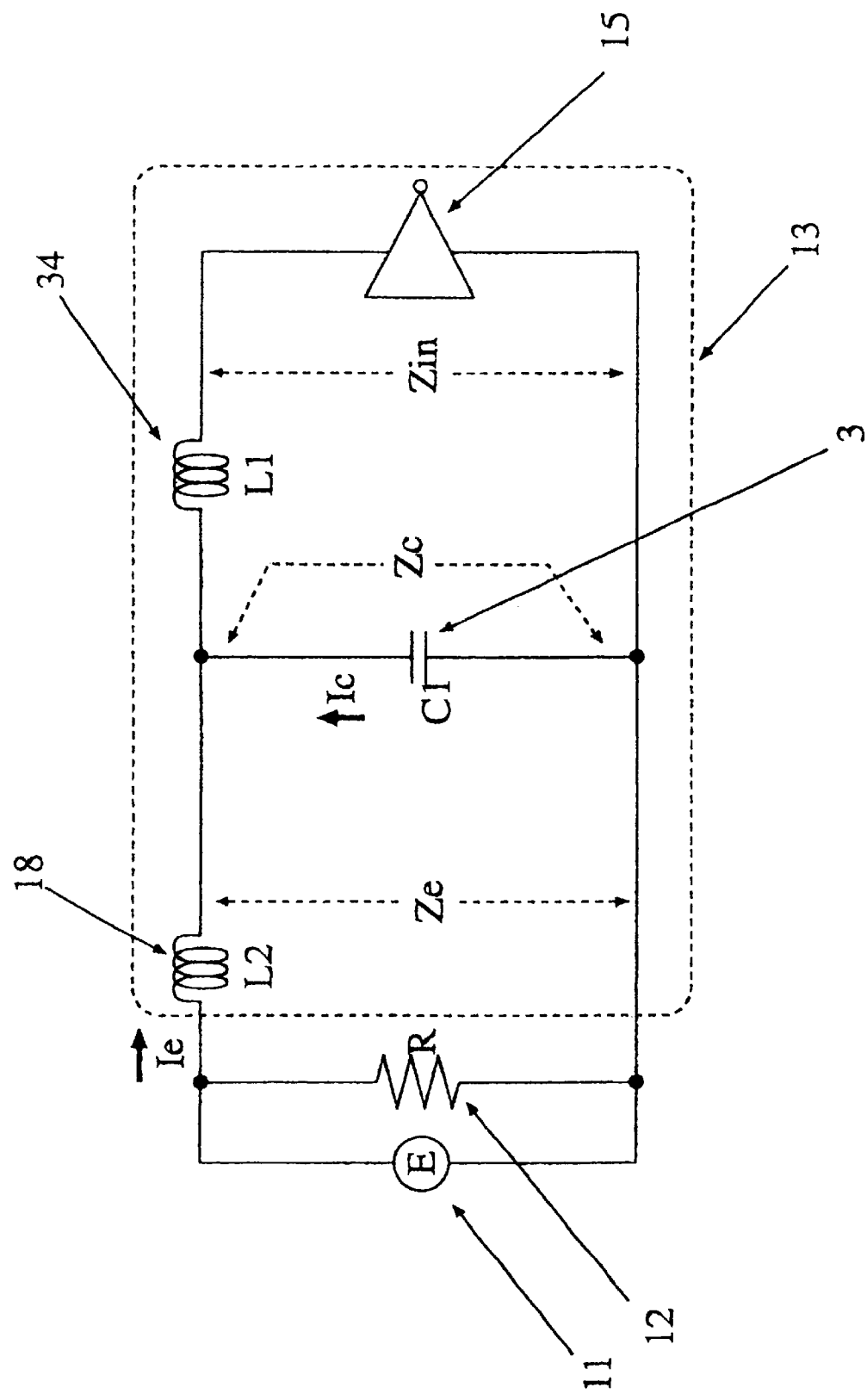
FIG. 12 is a circuit diagram of Embodiment 2 of the present invention (where a coil is connected on the side of the power supply (Vcc)).

FIG. 12 shows an equivalent circuit of the transmitter-side semiconductor element 15 and the vicinity thereof.

Referring to FIG. 12, the reference numeral 13 denotes the transmitter-side semiconductor package of this embodiment, 15 denotes the transmitter-side semiconductor element, 3 denotes the capacitor, 18 denotes the power supply (Vcc) side inductor, 34 denotes a parasitic inductance existing between the transmitter-side semiconductor element 15 and the capacitor 3, 11 denotes a power supply, and 12 denotes an internal resistance of the power supply 11.

With the above construction, the impedance Ze on the side of the power supply 11 as observed from the transmitter-side semiconductor package 13 is expressed by $Ze=R+j\omega L_2$ wherein $\omega$ denotes the frequency. An impedance Zc of the capacitor 3 is expressed by $Zc=1/j\omega C_1$. Assuming that $C_1=1000$ pF, $L_1=3$ nH, $L_2=30$ nH, $R=1\Omega$, and the frequency is 100 MHz, for example, $Ze=1+18.85j$ and $Zc=-1.59j$, indicating that an current Ie flowing from the power supply 11 is about one-eleventh of a current Ic flowing to the capacitor 3.

As a result, a high-frequency current flowing to the semiconductor element 15 hardly flows out from the transmitter-side semiconductor package 13, and thus a circuit capable of reducing source noise and electromagnetic radiation is realized.

In the above case, also, an impedance Zin on the side of the power supply as observed from the terminals of the transmitter-side semiconductor element 15 is expressed by $Zin = j\omega L_1+ZeZc/(Ze+Zc)=0.008+0.147j$, which is small enough to allow the semiconductor element 15 to operate.

When the semiconductor elements 15 and 16 are mounted right above the power supply (Vcc) plane 31, i.e., on the opposite surface of the substrate shown as the bottom surface in FIG. 11, a feedback current of a current flowing to the signal line 32 flows to the power supply (Vcc) plane 31, and thus the current loop 33 passes through the signal line 32 and the power supply (Vcc) plane 31.

In the above case, therefore, unlike the connection state shown in FIG. 11, the terminals 21 and 22 are selected for connection among the terminals 20 to 24 of the semiconductor package 13.

Therefore, in the circuit shown in FIG. 10, by connecting the terminal 22 to the ground via the line 26 and connecting the terminal 21 to the power supply (Vcc) via the line 29, the impedance of the current loop 33 is lowered while the impedance between the power supply and the ground as observed from the semiconductor package 13 is increased. In this way, an unnecessary high-frequency current is prevented from flowing to the ground plane 30 and the power supply (Vcc) plane 31 in the substrate.

Figure 13:
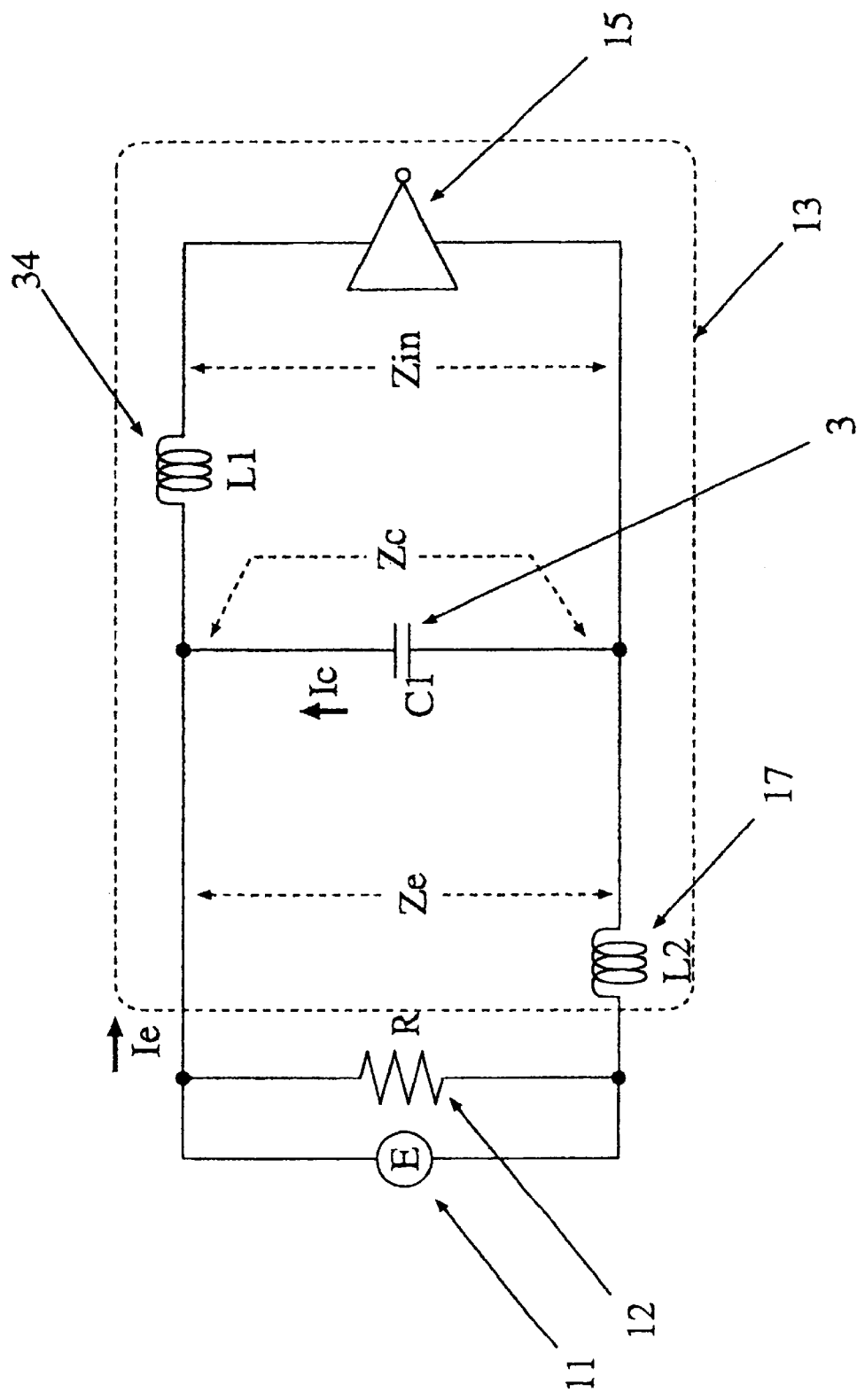
FIG. 13 is a circuit diagram of Embodiment 2 of the present invention (where a coil is connected on the side of the ground).

FIG. 13 shows an equivalent circuit of the transmitter-side semiconductor element 15 and the vicinity thereof in the above case.

The equivalent circuit of FIG. 13 is apparently different from that of FIG. 12 in that the ground-side inductor 17 is shown instead of the power supply (Vcc) side inductor 18. However, it is evident that each impedance obtained in this case is substantially the same as that obtained in the case of FIG. 12. Evidently, therefore, this construction can also realize a circuit capable of reducing source noise and electromagnetic radiation.

The semiconductor package having the circuit configuration shown in FIG. 10 was actually fabricated and mounted on a substrate. When the resultant device was driven at 33 MHz, the source noise was 30 mV. This is about a half the value obtained by a circuit configuration without the inductors 17 and 18, indicating that a large effect of reducing source noise is obtained.

Figure 14:
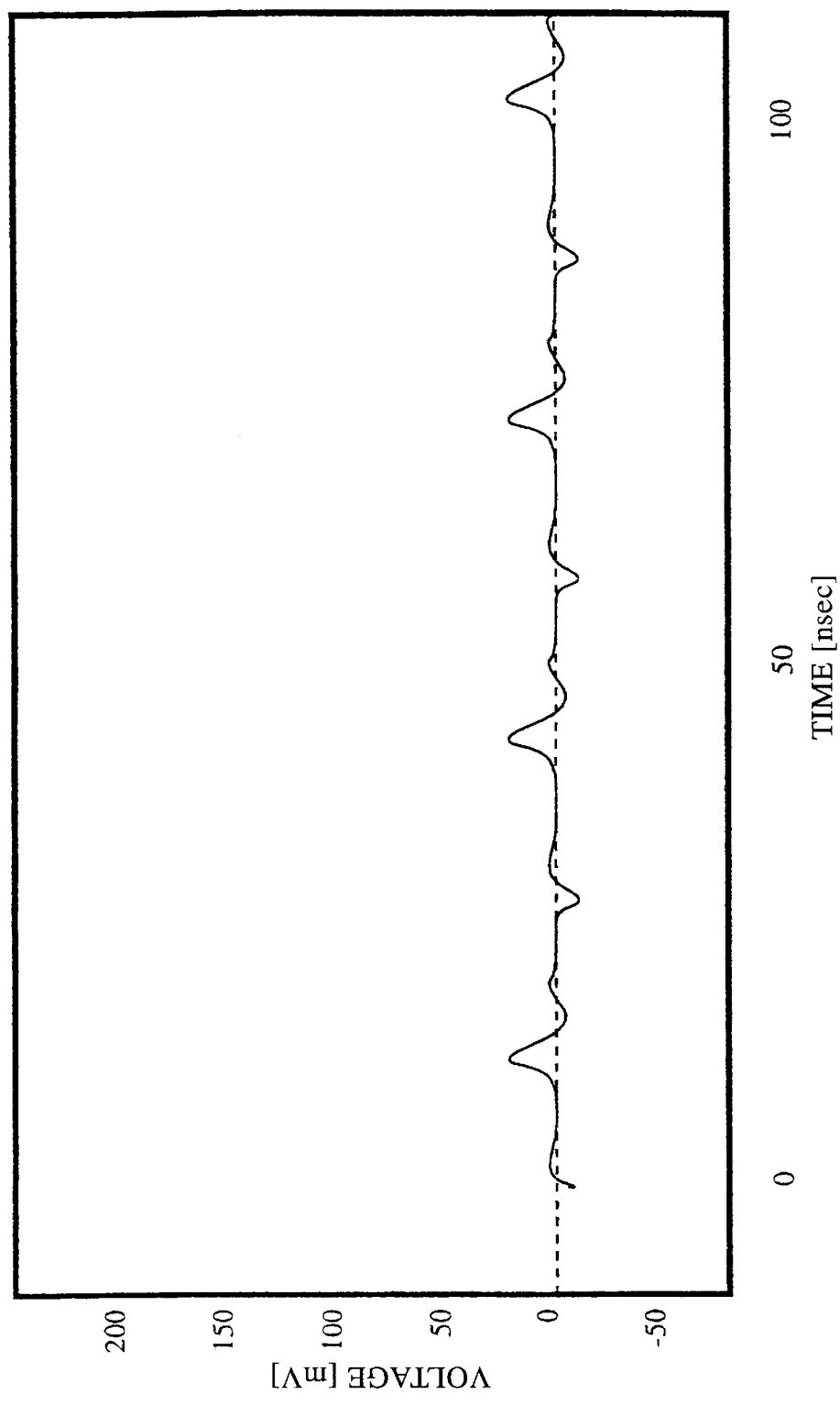
FIG. 14 is a view showing the measurement results of source noise in Embodiment 2 of the present invention.
Figure 15:
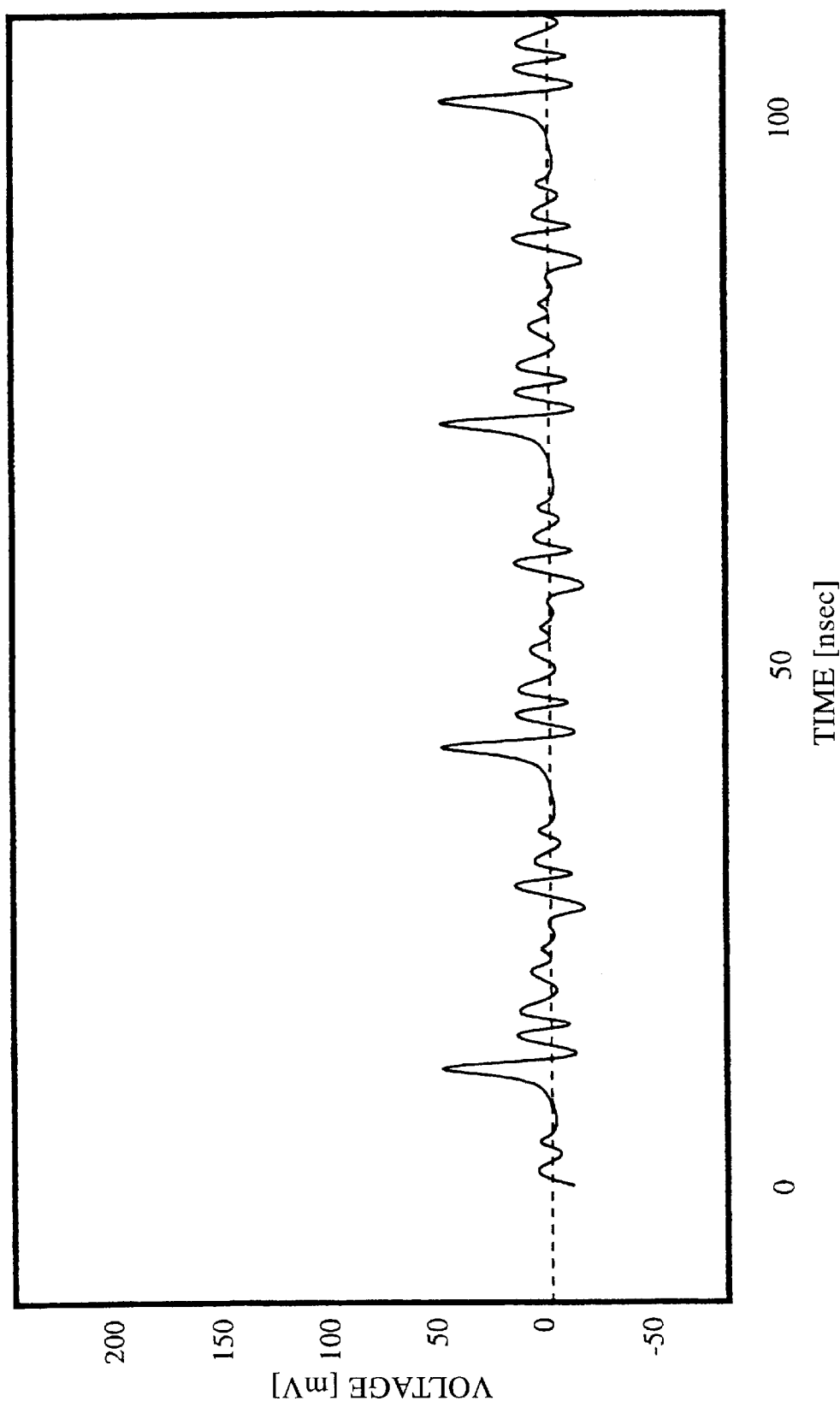
FIG. 15 is a view showing the measurement results of source noise in a comparative example where inductors 17 and 18 do not exist in Embodiment 2 of the present invention.

The semiconductor package having the circuit configuration shown in FIG. 10 was actually fabricated and mounted on a substrate. The resultant device was driven at 33 MHz and the source noise was measured. FIG. 14 is a view showing the results of this measurement of the source noise. FIG. 15 is a view showing the measurement results of source noise for the circuit configuration without the inductors 17 and 18.

As is observed from these figures, the source noise is about 30 mV for the circuit configuration of this embodiment, which is about a half the value obtained by the configuration without the inductors 17 and 18. This indicates that the circuit configuration of this embodiment provides a large effect of reducing source noise.

The above effect was obtained in both cases of mounting the semiconductor package right above the power supply (Vcc) plane and mounting it right above the ground plane.

On the contrary, in the case where the inductor was inserted fixedly only between the semiconductor element and the power supply (Vcc) plane, the effect of reducing source noise was observed when the semiconductor package was mounted right above the ground plane. However, when it was mounted right above the power supply (Vcc) plane, the output voltage from the output terminal decreased by 300 mV, increasing the rise time by 100 psec.

From the foregoing, it has been found that the effect of reducing source noise is obtained without sacrificing the properties of the semiconductor element by using the semiconductor package having the circuit configuration shown in FIG. 10 and changing the connection terminals used between the case where the semiconductor package is mounted right above the power supply (Vcc) plane and the case where it is mounted right above the ground plane.

Figure 16:
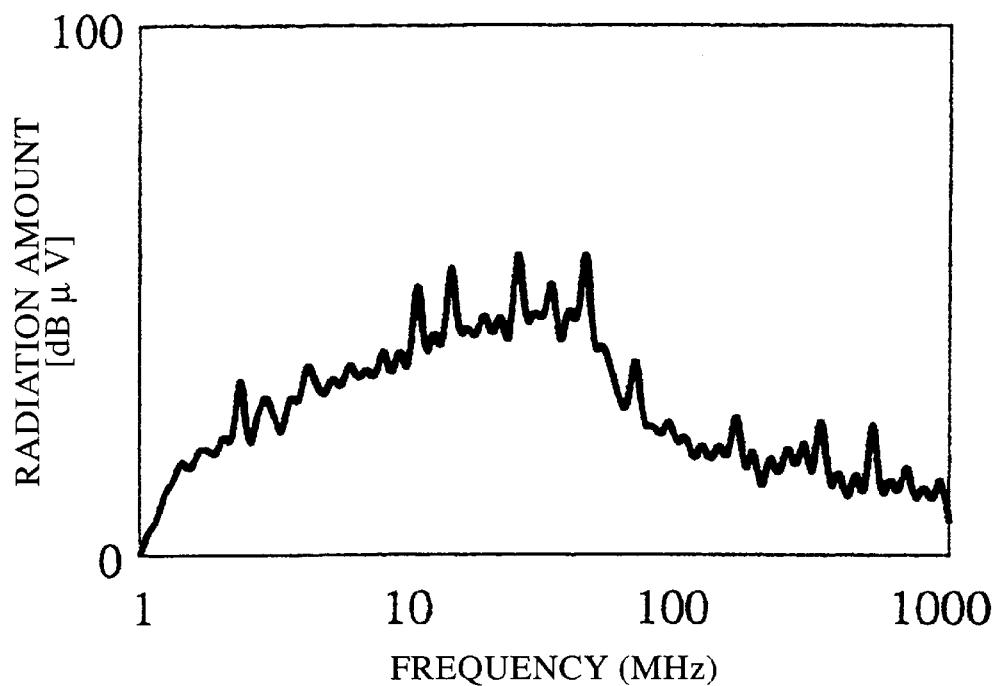
FIG. 16 is a view showing the measurement results of electromagnetic radiation in Embodiment 2 of the present invention.
Figure 17:
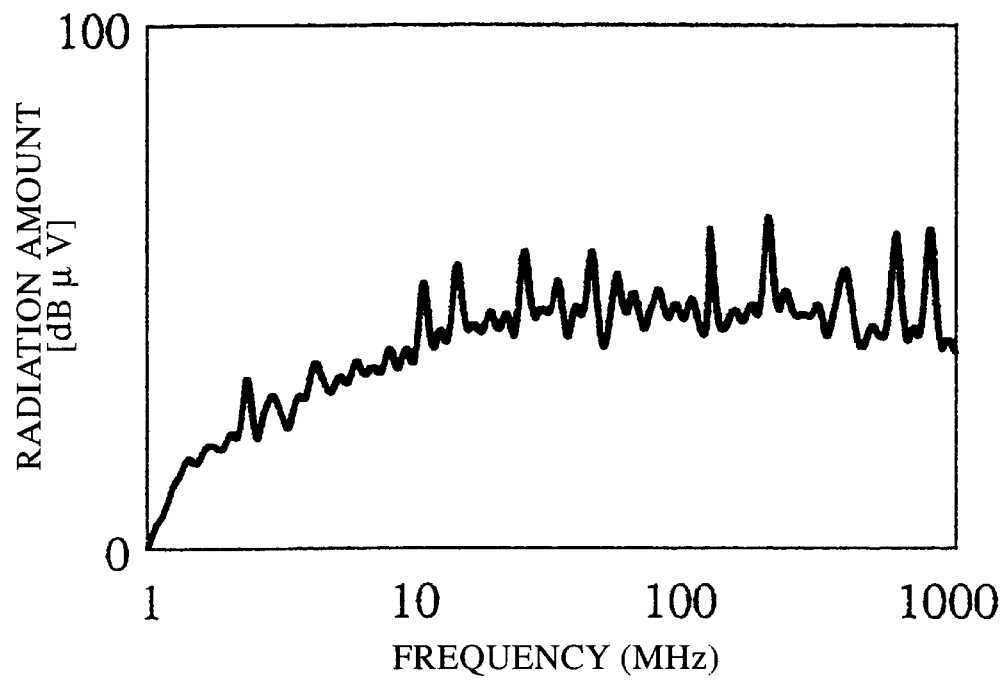
FIG. 17 is a view showing the measurement results of electromagnetic radiation in a conventional case.

The results of measurement of electromagnetic radiation are shown in FIGS. 16 and 17.

FIG. 16 shows the measurement results of electromagnetic radiation for the semiconductor package of this embodiment, whereas FIG. 17 shows the measurement results of electromagnetic radiation for a conventional semiconductor package.

It has been found from the above results that the semiconductor package having the circuit configuration shown in FIG. 10 can reduce electromagnetic radiation especially in the high-frequency range.

Also, it has been confirmed that, as in the case of the source noise, substantially the same effect is obtained in both cases of mounting the semiconductor package right above the power supply (Vcc) plane and mounting it right above the ground plane by changing the connection, not disposing the inductor fixedly between the power supply (Vcc) and the semiconductor circuit.

Thus, the semiconductor package having the circuit configuration shown in FIG. 10 can be mounted either right above the ground plane 30 or right above the power supply (Vcc) plane 31 by a single package construction, and also can realize a circuit capable of reducing source noise and electromagnetic radiation.

Furthermore, by mounting the inductors 17 and 18 and the capacitor 3 on the semiconductor package, it is possible to reduce the parasitic inductance 34 existing between the semiconductor element 15 or 16 and the capacitor 3, and thus reduce the first term of the equation, $Zin=j\omega L_1 + ZeZc/(Ze+Zc)$. By reducing the first term, it is possible to comparatively increase the second term, $ZeZc/(Ze+Zc)$, i.e., increase $ZeZc/(Ze+Zc)=(Zc/Ze)/(1+Zc/Ze)$. In other words, $Zc/Ze$ can be made large, indicating that a larger effect of reducing source noise and electromagnetic radiation is obtained.

When a capacitance is provided outside the semiconductor package, the parasitic inductance 10 may sometimes be as large as ten and several nH depending on the construction and structure. Therefore, if $L_1=15$ nH, for example, $|Zin|=7.69\Omega$.

On the contrary, when the semiconductor package having the circuit configuration shown in FIG. 10 is used, since $L_1=3$ nH, $|Zin|=0.147\Omega$, indicating that a larger effect of reducing electromagnetic radiation can be expected.

Figure 18:
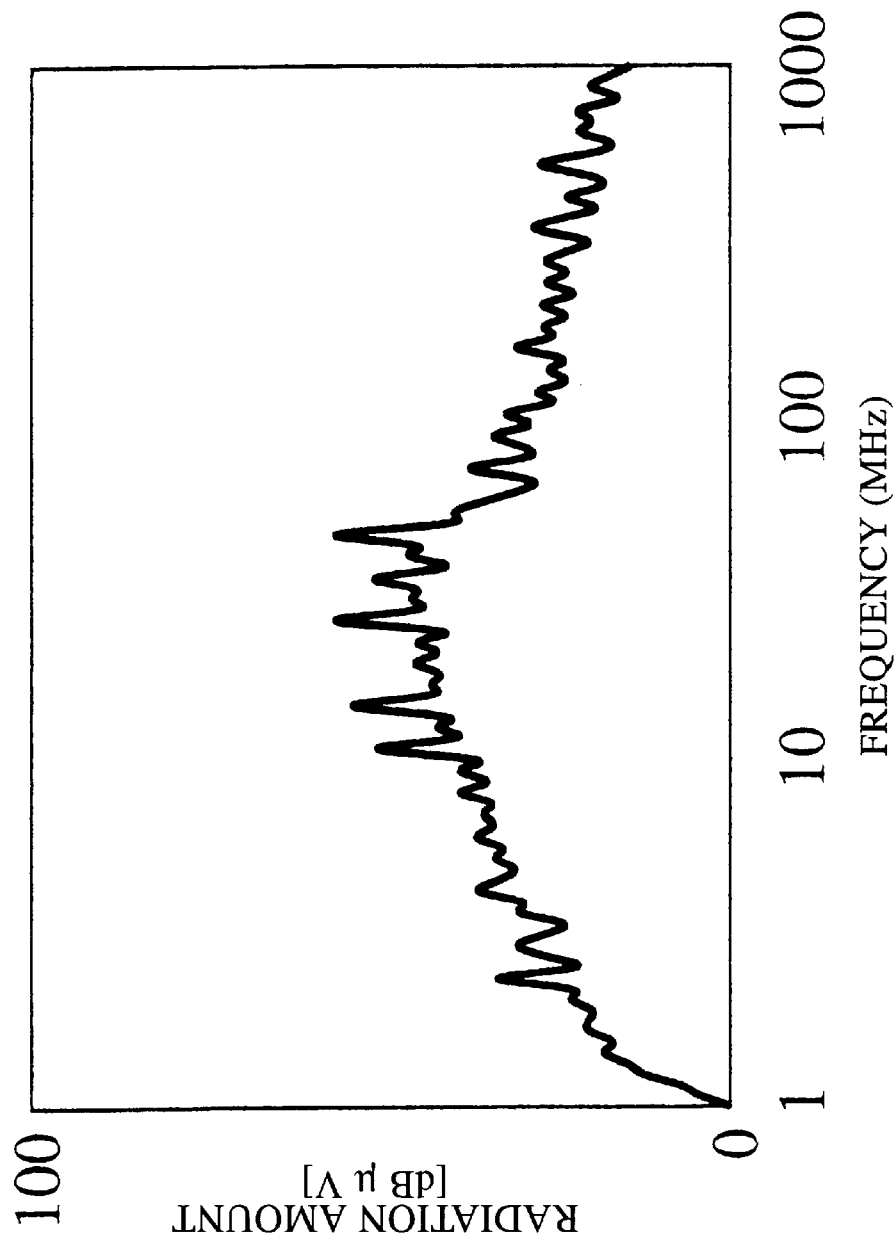
FIG. 18 is a view showing the measurement results of electromagnetic radiation in a comparative example where a capacitor 3 is disposed outside the semiconductor package in Embodiment 2 of the present invention.

FIG. 18 shows the measurement results of electromagnetic radiation obtained by actually disposing the capacitor 3 outside the semiconductor package as a comparative example. As is evident by comparing FIG. 18 with FIG. 16, the construction of having the capacitance inside the semiconductor package provides a larger effect of reducing electromagnetic radiation in the high-frequency range of about 100 MHz or more.

The capacitor 3 and the inductors 17 and 18 can be in any form as long as they function electrically as a capacitor and an inductor. For example, they may be in a form of a chip capacitor and a chip inductor, or may be an inductor formed on the transmitter-side semiconductor package 13 using an interconnect and a capacitor formed by disposing a conductor layer and an electrode inside the transmitter-side semiconductor package 13. In such cases, substantially the same effect is obtained.

Only the power supply (Vcc) and the ground were considered in this embodiment. It is evident, however, that in a semiconductor element which requires a plurality of supply voltages such as voltages obtained from a positive power supply and a negative power supply, also, substantially the same effect as that described above is obtained by arranging so that the power supply terminal of the semiconductor element is directly connected to the substrate only for the power supply/ground to which a feedback current of a current flowing to the output terminal flows, and the other power supply terminal is connected via the inductor.

Although the transmitter-side semiconductor package 13 was exemplified in this embodiment, it is evident that substantially the same effect is also obtained by the receiver-side semiconductor package 14. Further, evidently, substantially the same effect is obtained by providing the terminals 19, 20, 21, 22, 23, 24, and 25 and the lines 26, 27, 28, and 29 in plural numbers for each element.

Thus, the semiconductor package of Embodiment 2 is inexpensive since a single package can be shared for different uses. Only a small area is necessary for implementation of the semiconductor package since no element is required outside the package, facilitating reduction of the size of the resultant device. It is also evident that the capabilities such as reduction of the device size, reduction of the parasitic inductance, and reduction of source noise and electromagnetic radiation are advantageous in realizing a high-speed circuit.

(Embodiment 3)

Figure 19:
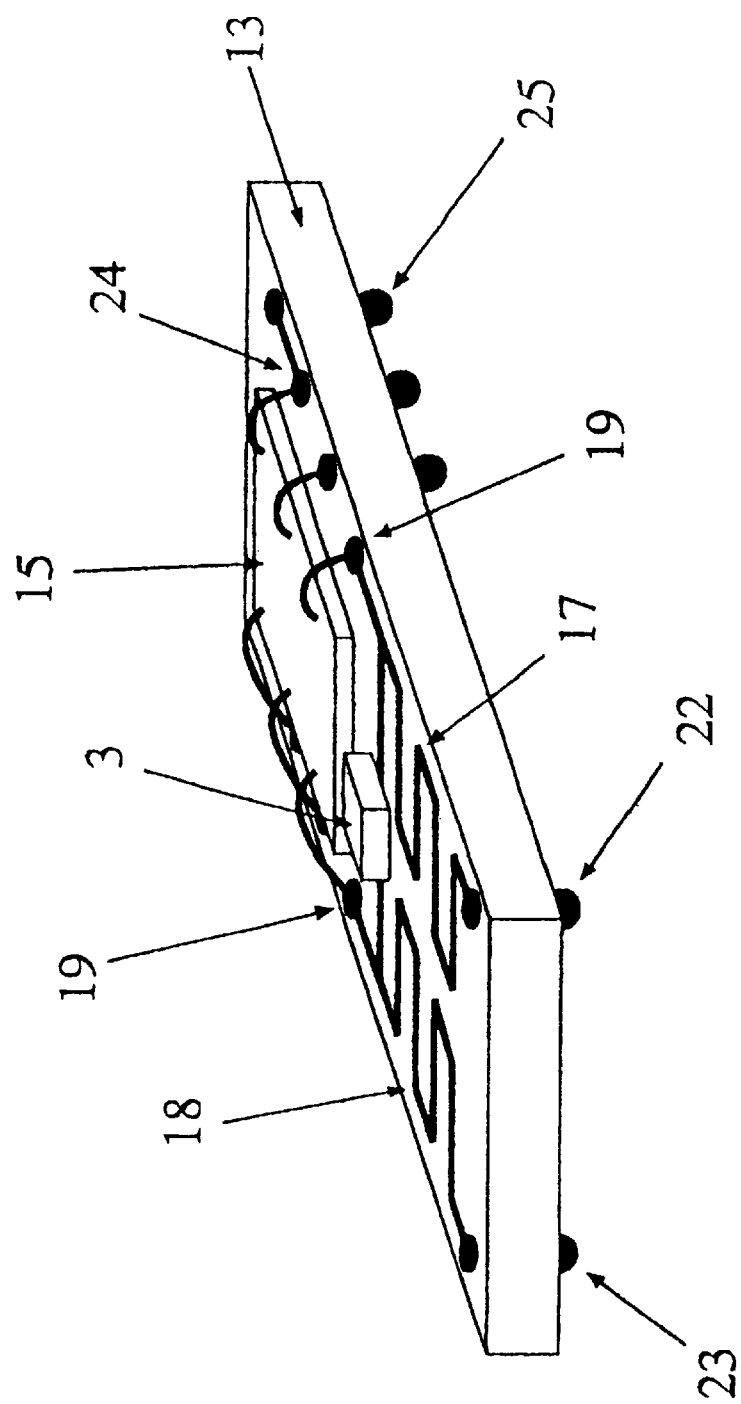
FIG. 19 is a view illustrating a structure of a semiconductor package of Embodiment 3 of the present invention.
Figure 20:
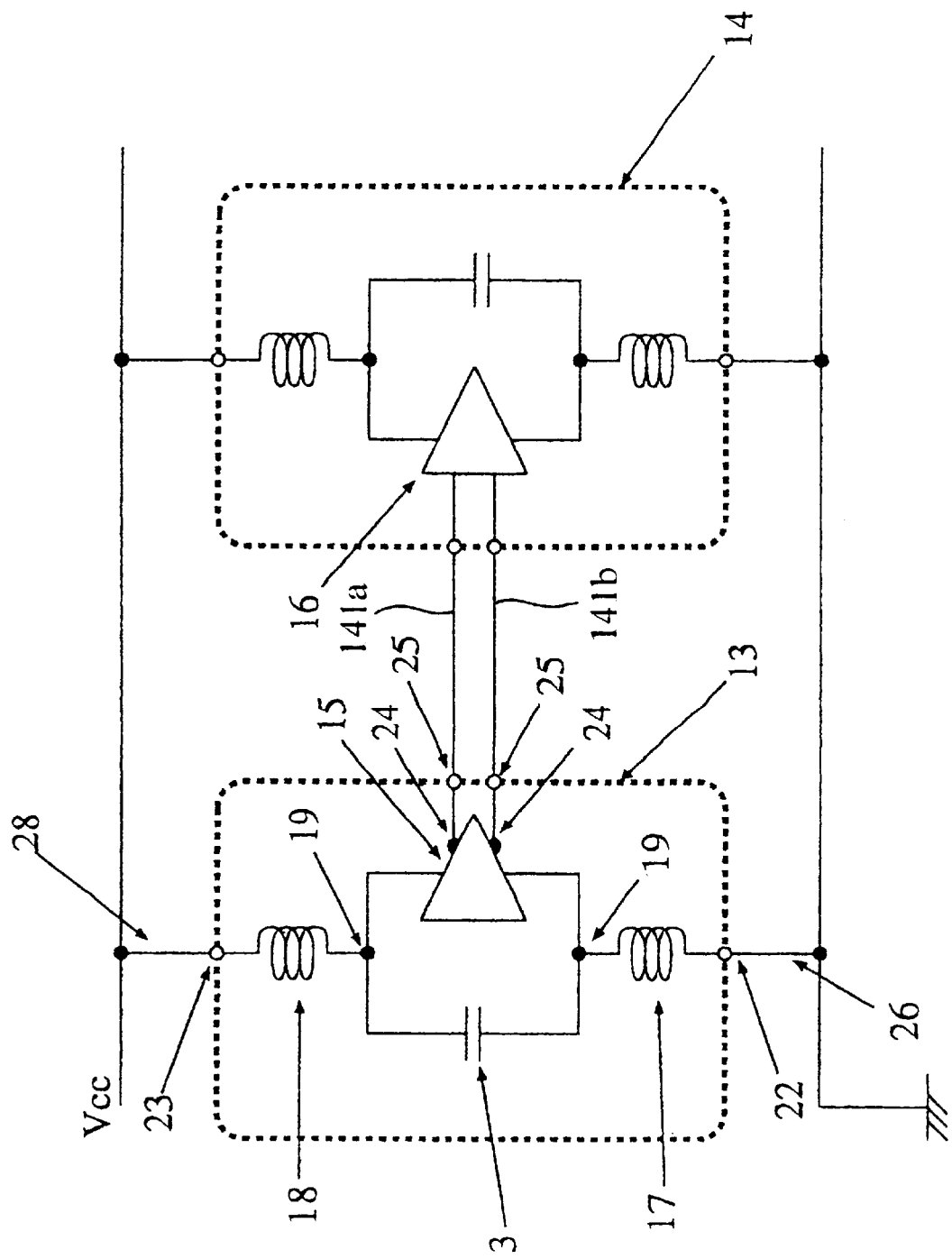
FIG. 20 is a view showing a circuit using the semiconductor package of Embodiment 3 of the present invention.

FIG. 19 is a perspective view of an exemplified structure of a semiconductor package of Embodiment 3 of the present invention. FIG. 20 shows a circuit diagram of a substrate with the semiconductor package of Embodiment 2 [sic] mounted thereon.

Referring to FIGS. 19 and 20, the reference numeral 13 denotes a transmitter-side semiconductor package of this embodiment, and 14 denotes a receiver-side semiconductor package according to the present invention. The reference numeral 15 denotes a transmitter-side semiconductor element, and 16 denotes a receiver-side semiconductor element. The reference numeral 3 denotes a capacitor, 17 denotes a ground-side inductor, and 18 denotes a power supply (Vcc) side inductor.

The reference numeral 19 denotes a terminal disposed on the transmitter-side semiconductor package 13 for connecting the transmitter-side semiconductor element 15 to the package. The reference numeral 22 denotes a terminal disposed on the package for connecting the ground-side inductor 17 to the ground, and 23 denotes a terminal disposed on the package for connecting the power supply (Vcc) side inductor 18 to the power supply (Vcc).

The reference numeral 24 denotes differential output terminals disposed on the transmitter-side semiconductor element 15 for connecting the output terminal of the semiconductor element 15 to the transmitter-side semiconductor package 13, and 25 denotes terminals disposed on the semiconductor package 13 for connecting the terminals 24 to the substrate. The reference numeral 26 denotes a line for connecting the terminal 22 to the ground, and 28 denotes a line for connecting the terminal 23 to the power supply (Vcc).

Figure 21:
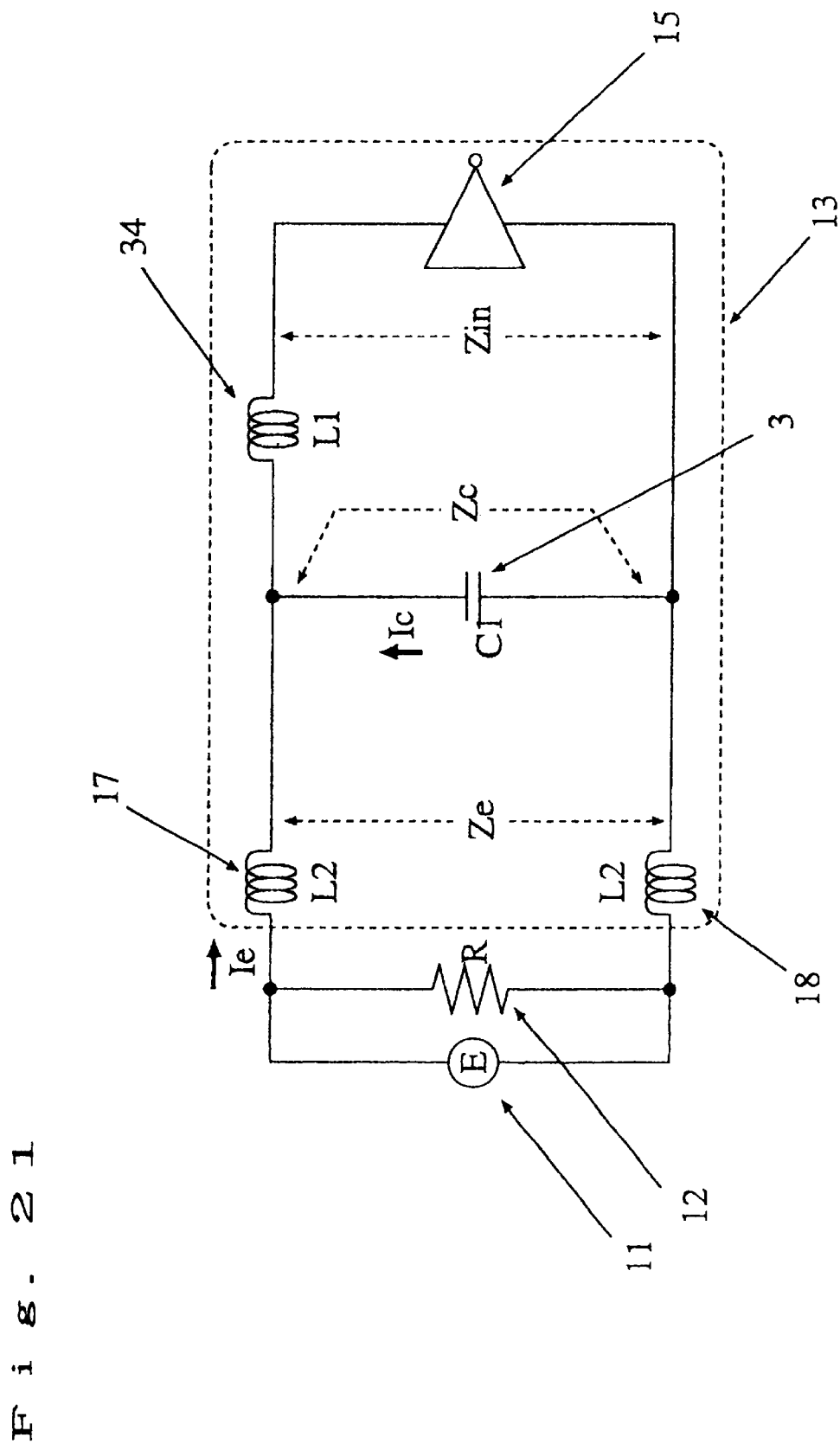
FIG. 21 is a view showing an equivalent circuit corresponding to a semiconductor element 2 and the vicinity thereof in Embodiment 3 of the present invention.

FIG. 21 shows an equivalent circuit of the transmitter-side semiconductor element 15 and the vicinity thereof.

The equivalent circuit of FIG. 21 is the same as that of FIG. 12 except that the inductors 17 and 18 are connected in series.

With the above construction, the impedance Ze on the side of the power supply 11 as observed from the transmitter-side semiconductor package 13 is expressed by $Ze=R+2j\omega L_2$ wherein $\omega$ denotes the frequency. An impedance Zc of the capacitor 3 is expressed by $Zc=1/j\omega C_1$.

Assuming that $C_1=1000$ pF, $L_1=3$ nH, $L_2=30$ nH, $R=1\Omega$, and the frequency is 100 MHz, for example, $Ze=1+37.70j$ and $Zc=-1.59j$, indicating that an current Ie flowing from the power supply 11 is about one-twenty-second of a current Ic flowing to the capacitor 3.

As a result, a high-frequency current flowing to the transmitter-side semiconductor element 15 hardly flows out from the transmitter-side semiconductor package 13, and thus a circuit capable of reducing source noise and electromagnetic radiation is realized.

In the above case, also, an impedance Zin on the side of the power supply as observed from the terminals of the transmitter-side semiconductor element 15 is expressed by $Zin = j\omega L_1 + ZeZc/(Ze+Zc) = 0.002+0.223j$, which is small enough to allow the transmitter-side semiconductor element 15 to operate.

Further, when the transmitter-side and receiver-side semiconductor elements 15 and 16 are disposed right above the power supply (Vcc) plane or the ground plane, a feedback current of a current flowing to a differential output line 141a (or 141b) flows to the other of the paired differential output lines, i.e., 141b (or 141a).

In other words, the above construction is usable for either construction where the ground plane or the power supply plane exists right below the differential output line 141a.

Furthermore, with the above construction, the power supply (Vcc) side inductor 17 and the ground-side inductor 18 contribute to increasing the impedance between the power supply and the ground as observed from the transmitter-side semiconductor package 13 without increasing the impedance of the signal line (differential output lines). In this way, an unnecessary high-frequency current is prevented from flowing to the ground plane and the power supply (Vcc) plane in the substrate.

The semiconductor package having the circuit configuration shown in FIG. 20 was actually fabricated and mounted on a substrate. When the resultant device was driven at 33 MHz, the source noise was 28 mV. This is about a half the value obtained by a circuit configuration without the inductors 17 and 18, indicating that a large effect of reducing source noise is obtained.

Figure 22:
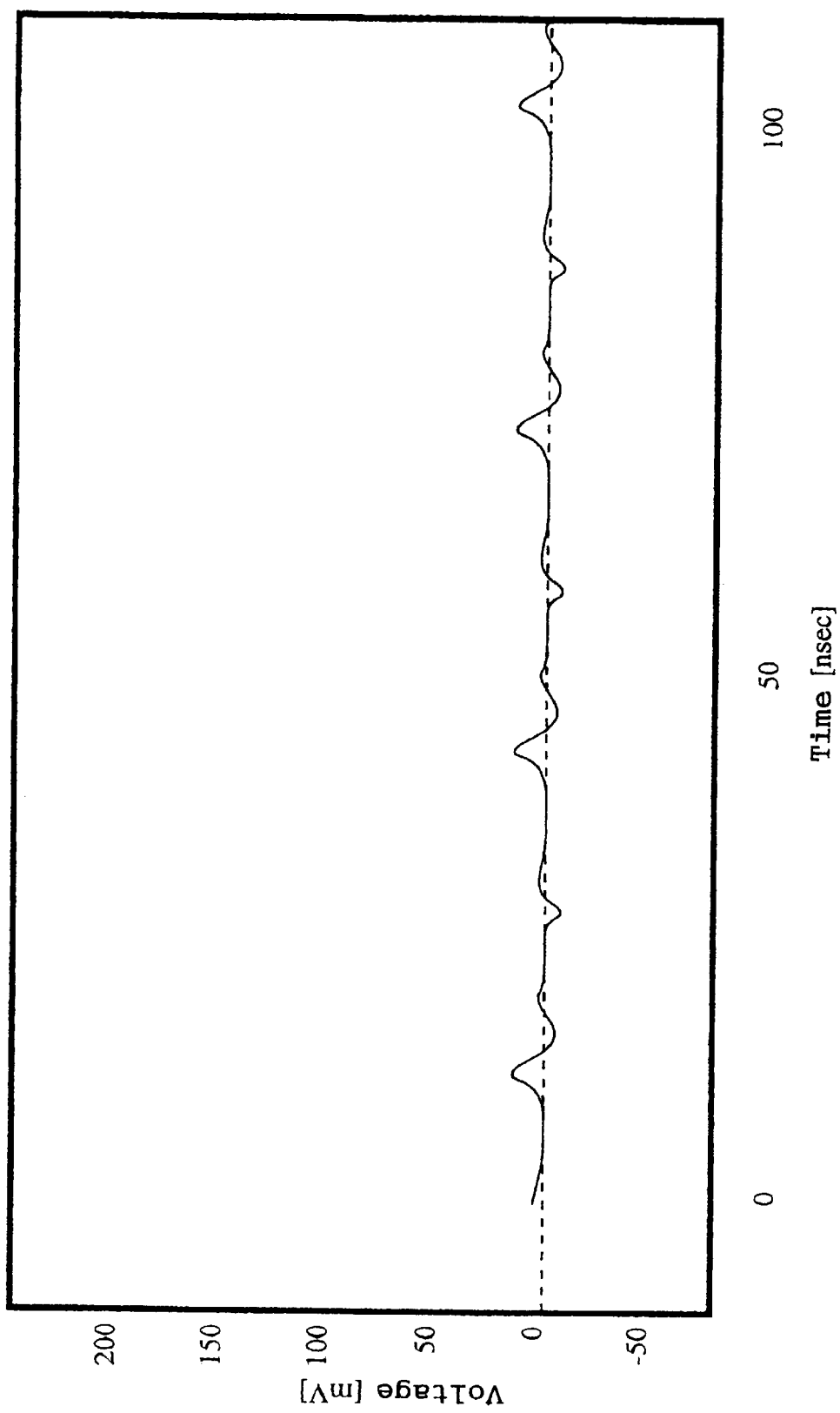
FIG. 22 is a view showing the measurement results of source noise in Embodiment 3 of the present invention.
Figure 23:
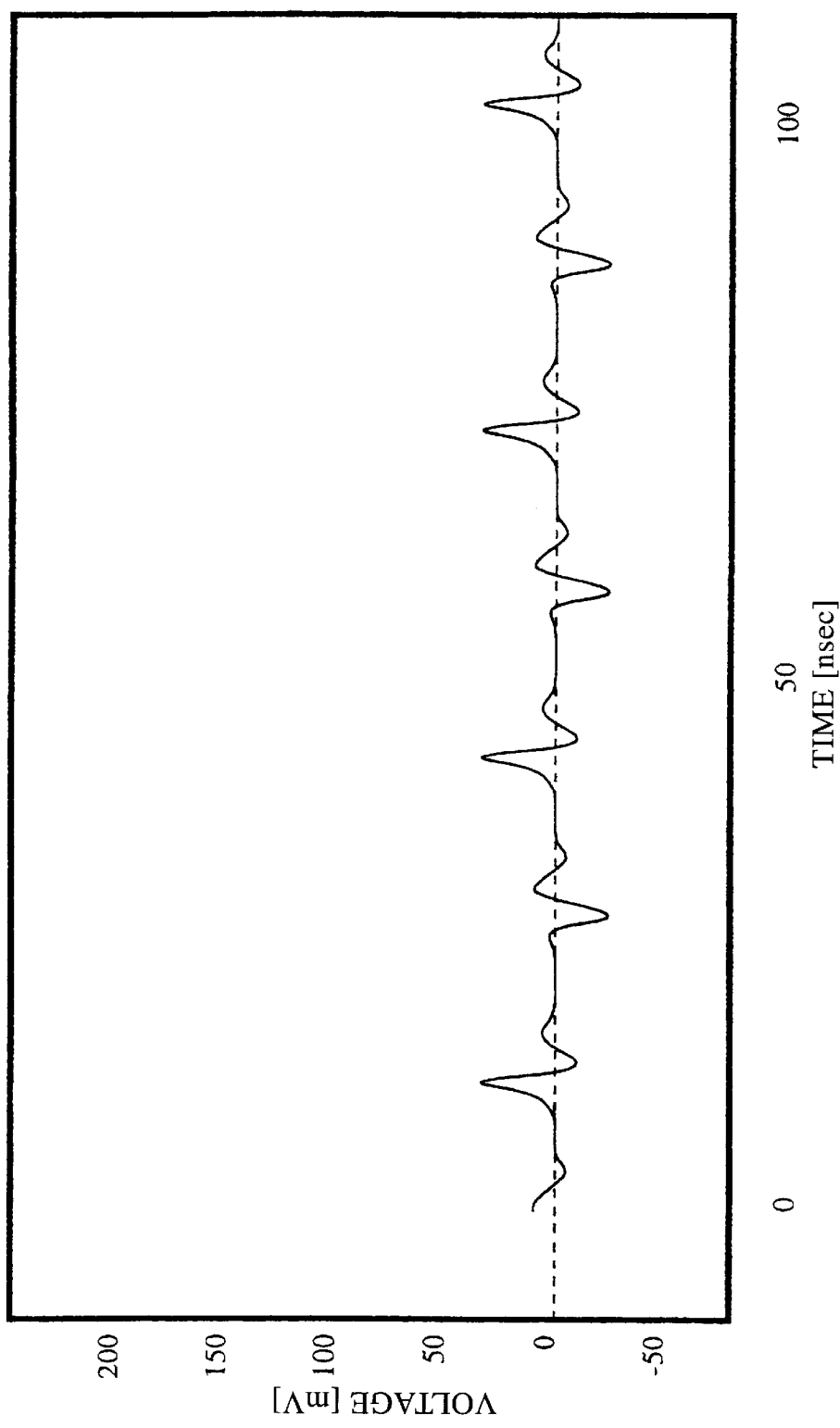
FIG. 23 is a view showing the measurement results of source noise in a comparative example where inductors 17 and 18 do not exist in Embodiment 3 of the present invention.

The semiconductor package having the circuit configuration shown in FIG. 20 was actually fabricated and mounted on a substrate. The resultant device was driven at 33 MHz and the source noise was measured. FIG. 22 is a view showing the results of this measurement of the source noise. FIG. 23 is a view showing the measurement results of source noise for a circuit configuration without the inductors 17 and 18.

As is observed from these figures, the source noise is about 30 mV for the circuit configuration of this embodiment, which is about a half the value obtained by the circuit configuration without the inductors 17 and 18. This indicates that the circuit configuration of this embodiment provides a large effect of reducing source noise.

Figure 24:
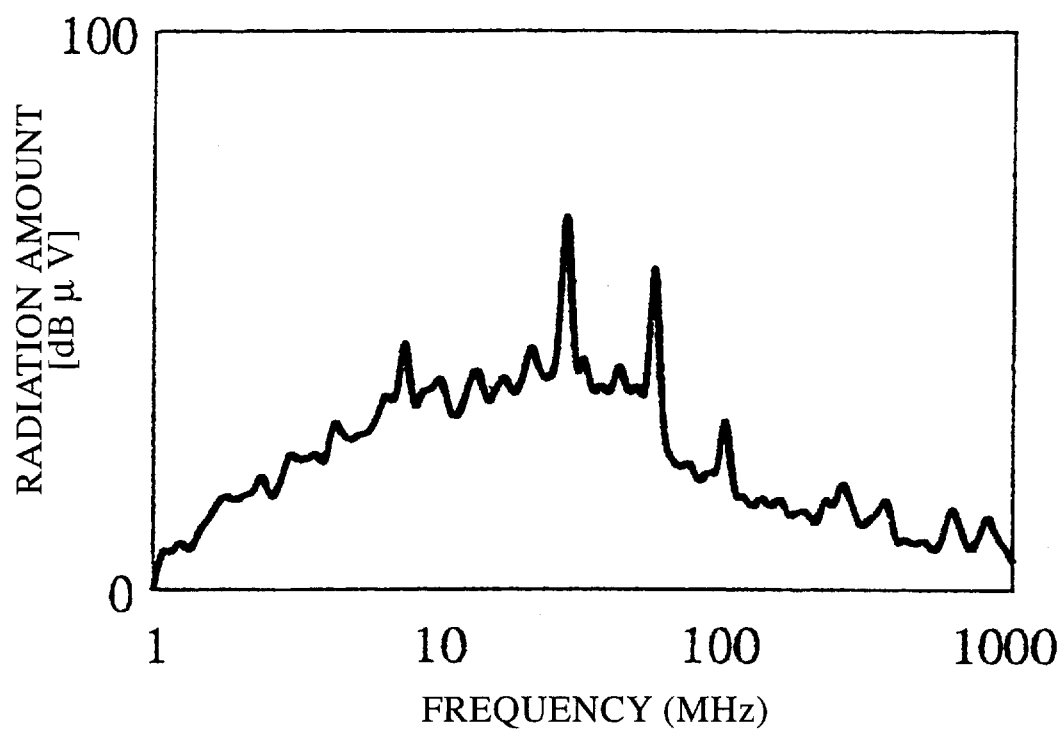
FIG. 24 is a view showing the measurement results of electromagnetic radiation in Embodiment 3 of the present invention.
Figure 25:
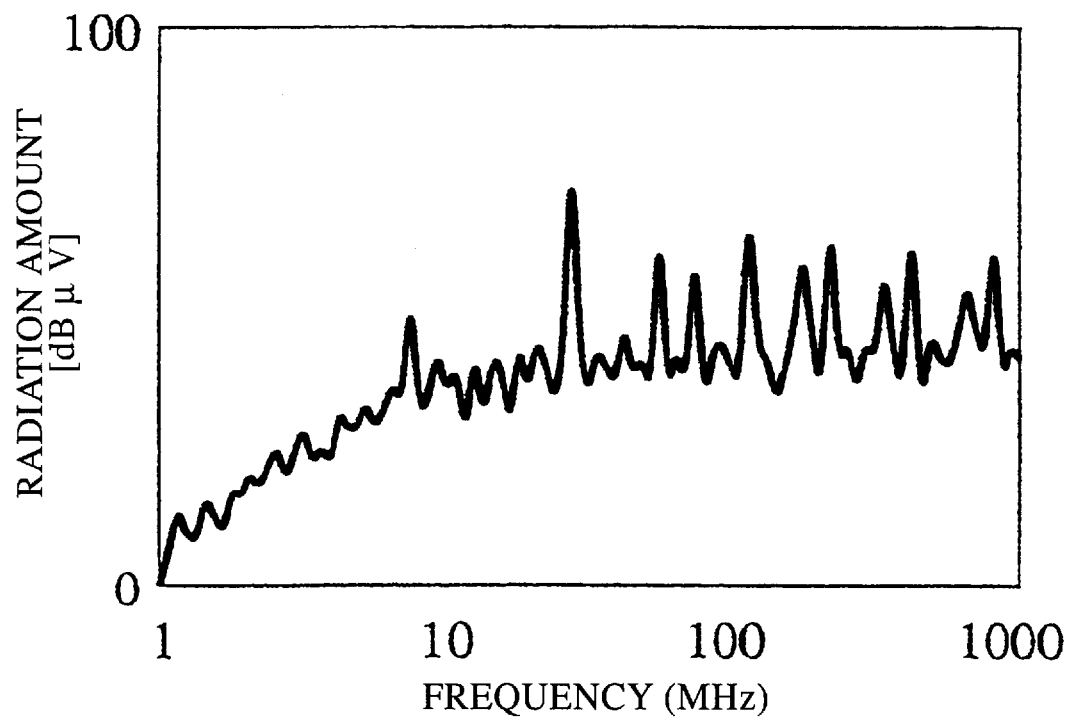
FIG. 25 is a view showing the measurement results of electromagnetic radiation in a conventional case.

Likewise, the results of measurement of electromagnetic radiation are shown in FIGS. 24 and 25. FIG. 24 shows the measurement results of electromagnetic radiation for the semiconductor package of this embodiment, whereas FIG. 25 shows the measurement results of electromagnetic radiation for a conventional semiconductor package.

It has been found from the above results that the semiconductor package having the circuit configuration shown in FIG. 20 can reduce electromagnetic radiation especially in the high-frequency range.

Thus by using the semiconductor package having the circuit configuration shown in FIG. 20, a circuit capable of reducing source noise and electromagnetic radiation is obtained.

Furthermore, by mounting the inductors 17 and 18 and the capacitor 3 on the semiconductor package, it is possible to reduce the parasitic inductance 34 existing between the transmitter-side or receiver-side semiconductor element 15 or 16 and the capacitor 3, and thus reduce the first term of the equation, $Zin=2j\omega L_1+ZeZc/(Ze+Zc)$.

By reducing the first term, it is possible to comparatively increase the second term, $ZeZc/(Ze+Zc)$, i.e., increase $ZeZc/(Ze+Zc)=(Zc/Ze)/(1+Zc/Ze)$. In other words, Zc/Ze can be made large, indicating that a larger effect of reducing source noise and electromagnetic radiation is obtained.

The capacitor 3 and the inductor 18 can be in any form as long as they function electrically as a capacitor and an inductor. For example, they may be in a form of a chip capacitor and a chip inductor, or may be an inductor formed on the transmitter-side or receiver-side semiconductor package 13 or 14 using an interconnect and a capacitor formed by disposing a conductor layer and an electrode inside the transmitter-side or receiver-side semiconductor package 13 or 14. In such cases, evidently, substantially the same effect is obtained.

Only the power supply (Vcc) and the ground were considered in this embodiment. It is evident, however, that in a semiconductor element which requires a plurality of supply voltages such as voltages obtained from a positive power supply and a negative power supply, also, substantially the same effect as that described above is obtained by arranging so that the power supplies be connected via an inductor.

Further, evidently, substantially the same effect is obtained by providing the terminals 19, 22, 23, 24, and 25 and the lines 26 and 28 in plural numbers for each element.

Thus, the semiconductor package of Embodiment 3 is inexpensive since a single package can be shared for different uses. Only a small area is necessary for implementation of the semiconductor package since no element is required outside the package, facilitating reduction of the size of the resultant device. It is also evident that the capabilities such as reduction of the device size, reduction of the parasitic inductance, and reduction of source noise and electromagnetic radiation are advantageous in realizing a high-speed circuit.

As is evident from the above embodiments, the present invention aims at providing an optimal construction for reducing source noise and electromagnetic radiation by decoupling semiconductor circuits from each other with respect to high frequency using a decoupling coil and a bypass capacitor disposed on a carrier substrate, to realize a circuit configuration which reduces source impedance in low frequency, reduces the area for implementation, costs low, and is suitable for high-speed operation.

Further, the present invention allows for manufacture of a semiconductor package in which limitation on implementation is eliminated by changing terminals to be used between the case where the ground plane exists right under the substrate surface and the case where the power supply plane exists right under the substrate surface, to realize a circuit configuration which reduces source impedance in low frequency, reduces the area for implementation, costs low, and is suitable for high-speed operation.

Figure 29:
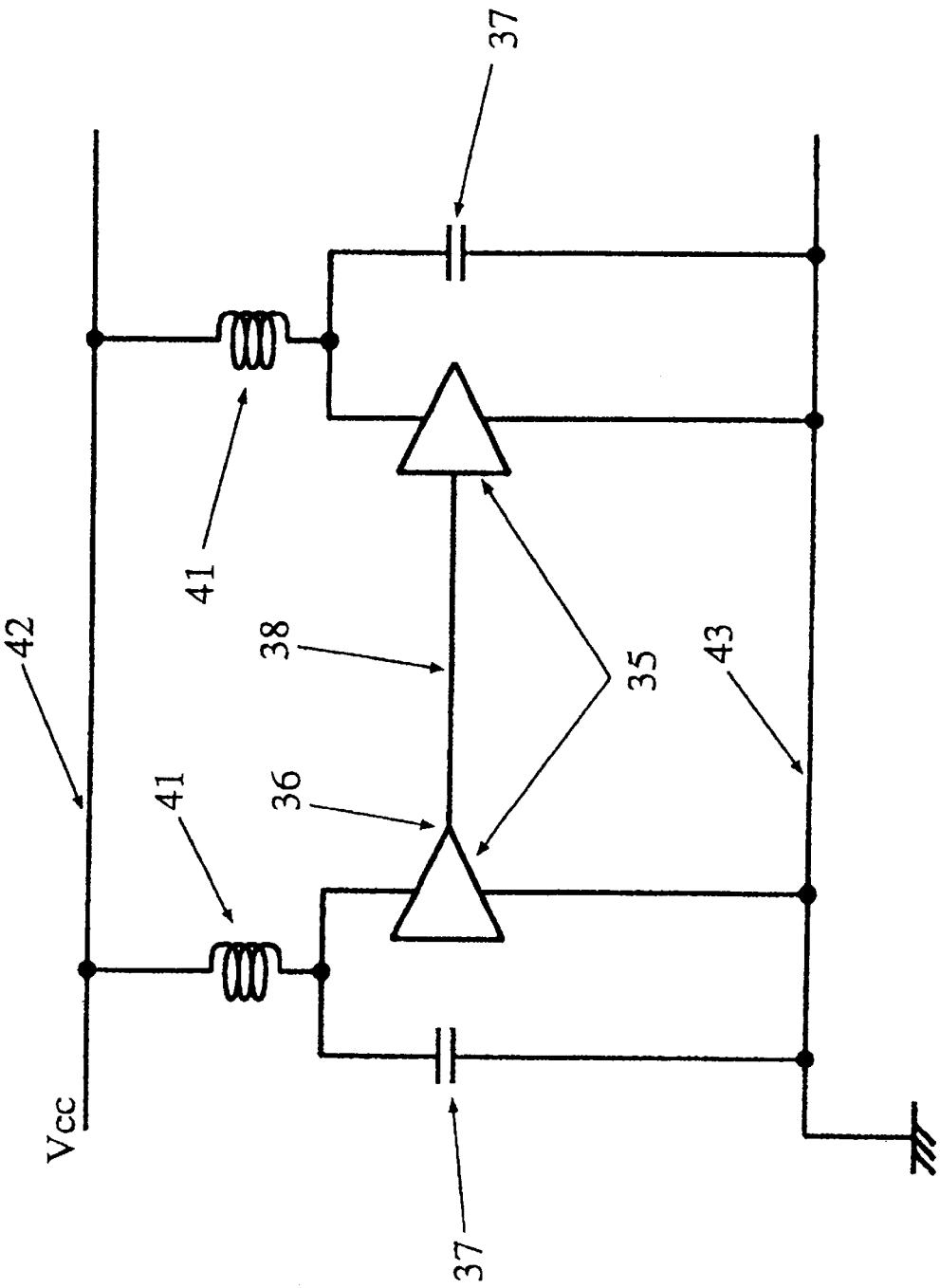
FIG. 29 is a circuit diagram of a construction employing a conventional decoupling method.

In the above embodiments, the semiconductor package was used. Alternatively, the following construction may also be used as a construction for solving the prior art problems inherent in the semiconductor integrated circuit shown in FIG. 29 described above.

That is, the construction is an electric circuit including: a semiconductor element having at least one power supply terminal and at least one ground terminal; at least one inductance; and at least one capacitor, wherein one of opposing terminals of the capacitor is connected to the power supply terminal while the other terminal is connected to the ground terminal, the power supply terminal is connected to a power supply, and the ground terminal is grounded via the inductance.

Figure 26:
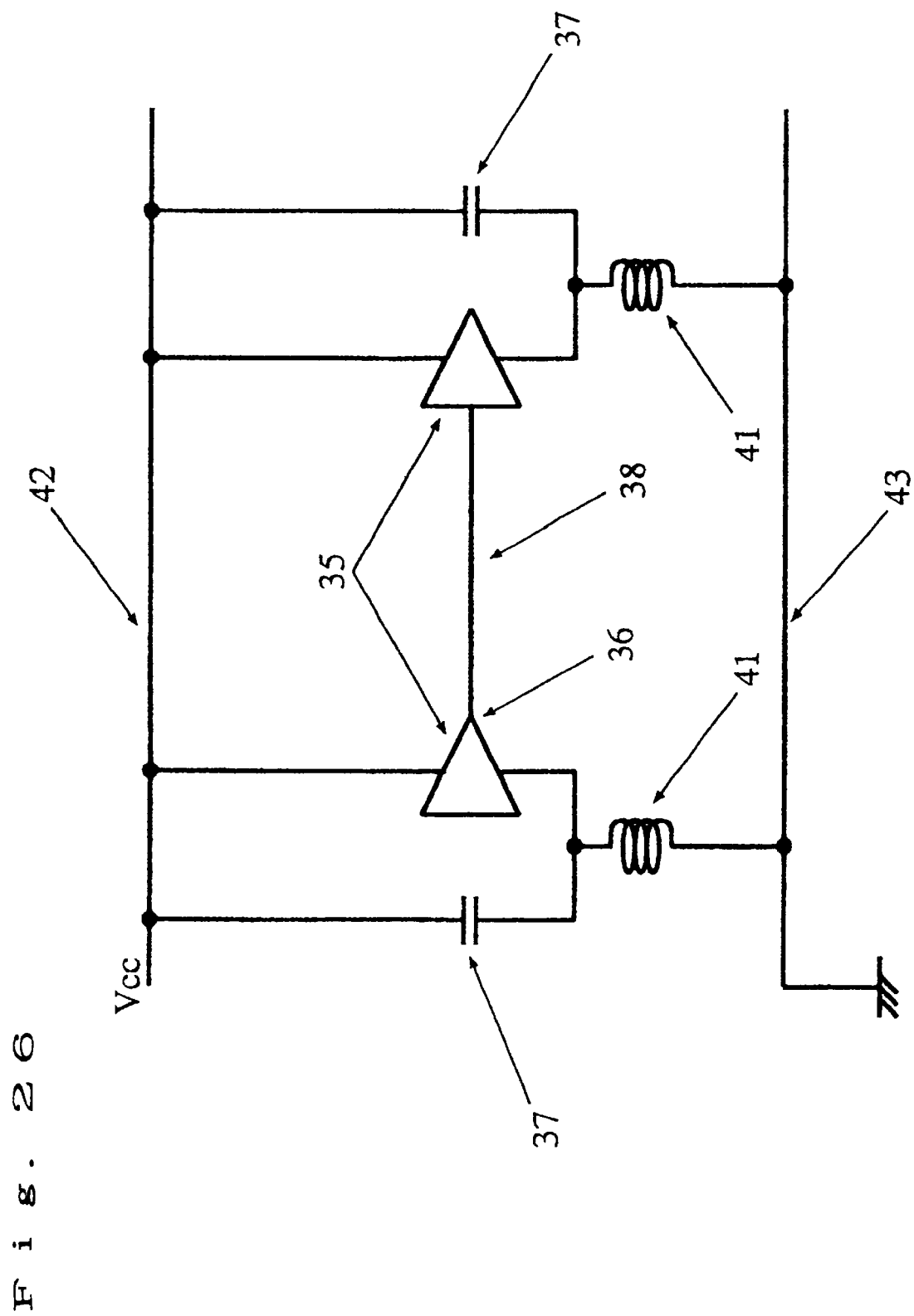
FIG. 26 is a circuit diagram of a construction employing a decoupling method according to the present invention (where a decoupling coil is disposed on the side of the ground).

More specifically, as shown in FIG. 26, when a signal line 38 constitutes a micro-strip line structure with a power supply plane 42, a decoupling coil 41 is formed on the side of a ground plane 43.

With the above construction, a feedback current of a current flowing to an output terminal 36 flows to the power supply plane 42, not via the decoupling coil 41. This prevents the impedance from increasing and thus allows for high-speed operation compared with that conventionally attained.

Figure 27:
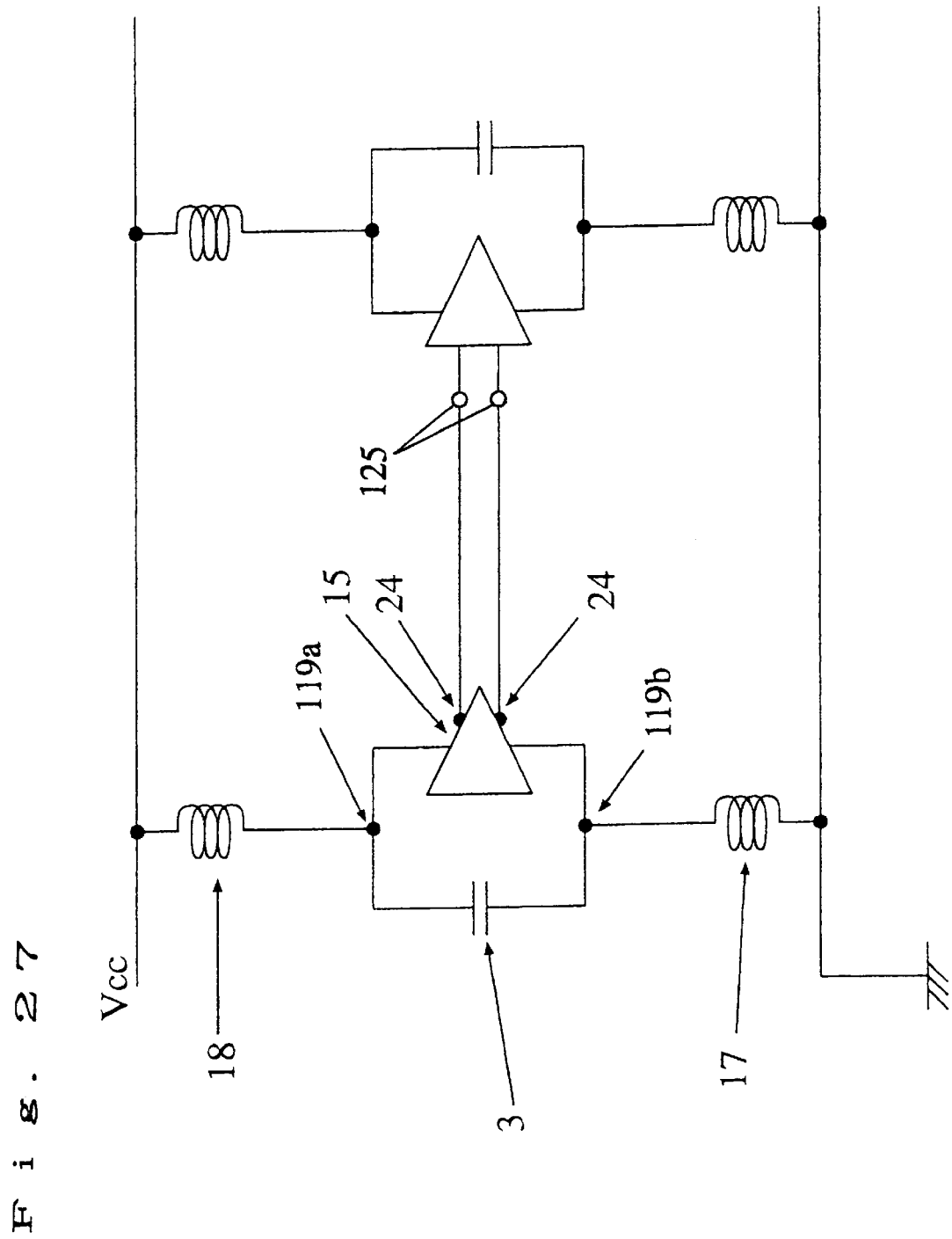
FIG. 27 is a view showing a circuit configuration of a modification of Embodiment 3 where a semiconductor package is not used.
Figure 28:
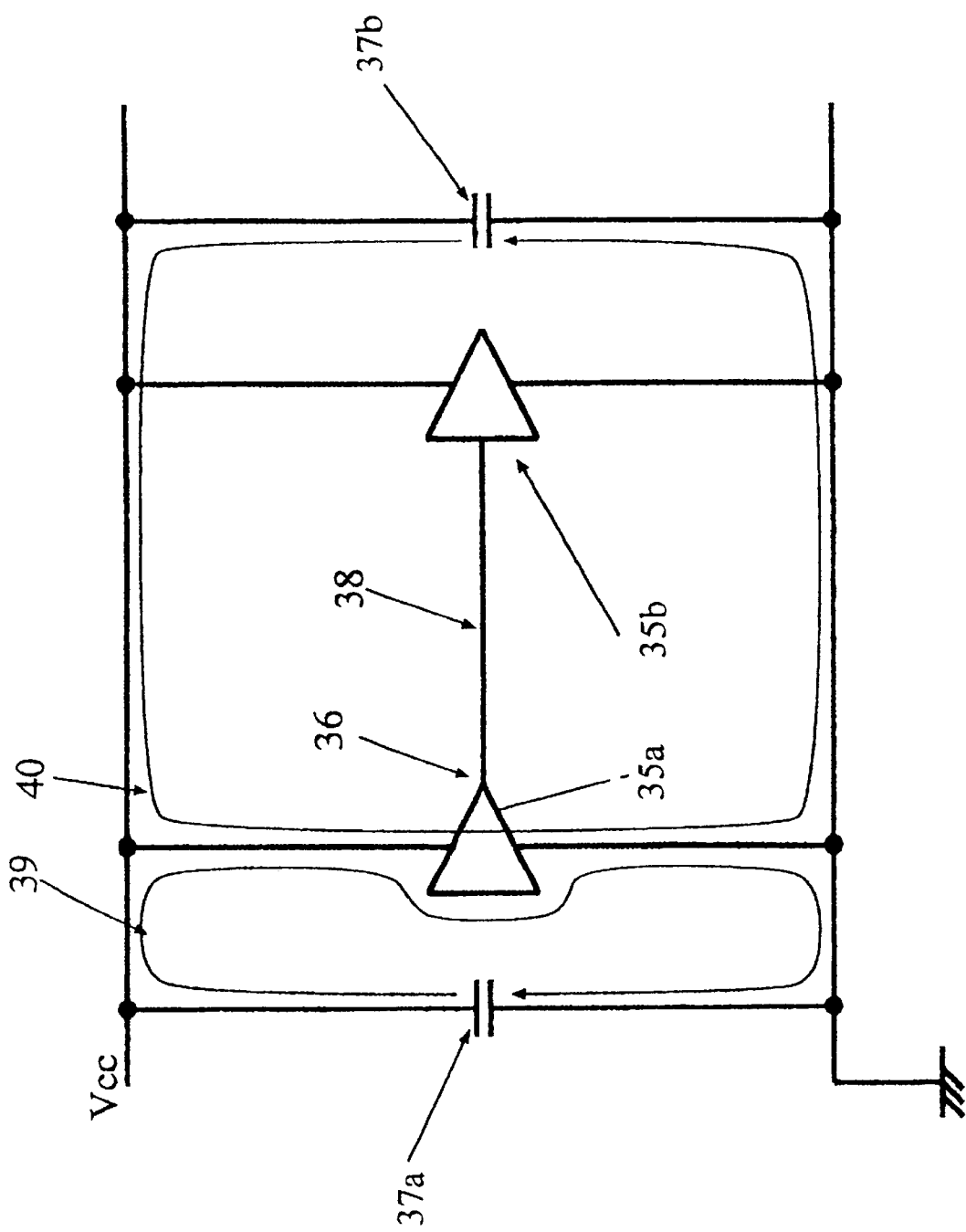
FIG. 28 is a view showing a current flowing to a conventional semiconductor circuit.

In one of the above embodiments, the case of mounting the semiconductor element having a pair of differential output terminals on the semiconductor package was described. Alternatively, a circuit configuration as shown in FIG. 27, for example, may also be used.

More specifically, the electric circuit in the above case includes: a semiconductor element 15 having at least one power supply terminal 119a, at least one ground terminal 119b, and at least one pair of differential output terminals 24; at least two inductances 17 and 18; and at least one capacitance 3, wherein one of opposing terminals of the capacitor 3 is connected to the power supply terminal 119a of the semiconductor element 15 while the other terminal is connected to the ground terminal 119b of the semiconductor element 15, the ground terminal 119b of the semiconductor element 15 is grounded via the first inductance 17 of the at least two inductances, the power supply terminal 119a of the semiconductor element 15 is connected to a power supply Vcc via the second inductance 18 of the at least two inductances, and the pair of differential output terminals 24 of the semiconductor element 15 are connected to a pair of terminals 125. With this construction, the value of the inductance can be set at a large value, and thus effects of realizing high-speed operation and further reducing source noise are obtained.

As is evident from the above description, the electric circuit according to the present invention further reduces source noise and electromagnetic radiation and realizes high-speed operation.

The semiconductor package of the present invention, as well as the implemented structure thereof, eliminate limitation on implementation, and realize a circuit configuration which reduces source impedance in low frequency, reduces the area for implementation, costs low, and is suitable for high-speed operation.

As is evident from the above description, the present invention has advantages of further reducing source noise and electromagnetic radiation and realizing high-speed operation.

What is claimed is:

1. An electric circuit comprising:
   a semiconductor element having at least one power supply terminal and at least one ground terminal;
   at least one non-parasitic inductance; and
   at least one capacitance,
   wherein one terminal of opposing terminals of the capacitance is connected to the power supply terminal and the other terminal is connected to the ground terminal,
   the power supply terminal is connected to a power supply, and
   the ground terminal is grounded exclusively via the inductance.

2. A semiconductor package comprising: (1) a semiconductor element having at least one power supply terminal, at least one ground terminal, and at least one output terminal; (2) at least one non-parasitic inductance; and (3) at least one capacitance,
   wherein one terminal of opposing terminals of the capacitance is connected to the power supply terminal of the semiconductor element and the other terminal is connected to the ground terminal of the semiconductor element,
   the ground terminal of the semiconductor element is connected to a ground terminal of the semiconductor package without a capacitive element therebetween,
   the power supply terminal of the semiconductor element is connected to a power supply terminal of the semiconductor package via the inductance, and
   the output terminal of the semiconductor element is connected to an output terminal of the semiconductor package.

3. A semiconductor package comprising: (1) a semiconductor element having at least one power supply terminal, at least one ground terminal, and at least one output terminal; (2) at least one non-parasitic inductance; and (3) at least one capacitance, wherein one terminal of opposing terminals of the capacitance is connected to the power supply terminal of the semiconductor element and the other terminal is connected to the ground terminal of the semiconductor element, the power supply terminal of the semiconductor element is connected to a power supply terminal of the semiconductor package, the ground terminal of the semiconductor element exclusively is connected to a ground terminal of the semiconductor package via the inductance, and the output terminal of the semiconductor element is connected to an output terminal of the semiconductor package.

4. A semiconductor package comprising: (1) a semiconductor element having at least one power supply terminal, at least one ground terminal, and at least one output terminal; (2) at least two inductances; and (3) at least one capacitance, wherein one terminal of opposing terminals of the capacitance is connected to the power supply terminal of the semiconductor element and the other terminal is connected to the ground terminal of the semiconductor element, the ground terminal of the semiconductor element is connected to a first ground terminal of the semiconductor package, the power supply terminal of the semiconductor element is connected to a first power supply terminal of the semiconductor package, the ground terminal of the semiconductor element is connected to a second ground terminal of the semiconductor package via a first inductance of the at least two inductances, the power supply terminal of the semiconductor element is connected to a second power supply terminal of the semiconductor package via a second inductance of the at least two inductances, and the output terminal of the semiconductor element is connected to an output terminal of the semiconductor package.

5. A semiconductor package comprising: (1) a semiconductor element having at least one power supply terminal, at least one ground terminal, and at least one pair of differential output terminals; (2) at least two inductances; and (3) at least one capacitance, wherein one terminal of opposing terminals of the capacitance is connected to the power supply terminal of the semiconductor element and the other terminal is connected to the ground terminal of the semiconductor element, the ground terminal of the semiconductor element is connected to a ground terminal of the semiconductor package via the first inductance of the at least two inductances, the power supply terminal of the semiconductor element is connected to a power supply terminal of the semiconductor package via the second inductance of the at least two inductances, and the pair of differential output terminals of the semiconductor element are connected to a pair of differential output terminals of the semiconductor package.

6. An electric circuit comprising:

(1) a semiconductor element having at least one power supply terminal, at least one ground terminal, and at least one pair of differential output terminals;

at least two inductances; and at least one capacitance, wherein one terminal of opposing terminals of the capacitance is connected to the power supply terminal of the semiconductor element and the other terminal is connected to the ground terminal of the semiconductor element, the ground terminal of the semiconductor element is grounded via a first inductance of the at least two inductances, the power supply terminal of the semiconductor element is connected to a power supply via a second inductance of the at least two inductances, and the pair of differential output terminals of the semiconductor element are connected to a pair of terminals.

7. A semiconductor package according to claim 2, further comprising:

a substrate on which the semiconductor package is mounted, the substrate having a ground plane formed on an inner layer, wherein a signal line is connected to the output terminal of the semiconductor element, and the ground plane is formed on a first inner layer under the signal line.

8. A semiconductor package according to claim 3, further comprising:

a substrate on which the semiconductor package is mounted, the substrate having a power supply plane formed on an inner layer, wherein a signal line is connected to the output terminal of the semiconductor element, and the power supply plane is formed on a first inner layer under the signal line.

9. A semiconductor package according to claim 4, further comprising:

a substrate on which the semiconductor package is mounted, the substrate having a ground plane and a power supply plane formed on respective inner layers, wherein a signal line is connected to the output terminal of the semiconductor element, the ground plane is formed on a first inner layer of the inner layers under the signal line, the first ground terminal is connected to the ground plane, and the second power supply terminal is connected to the power supply plane.

10. A semiconductor package according to claim 4, further comprising:

a substrate on which the semiconductor package is mounted, the substrate having a ground plane and a power supply plane formed on respective inner layers, wherein a signal line is connected to the output terminal of the semiconductor element, the power supply plane is formed on a first inner layer of the inner layers under the signal line, the first power supply terminal is connected to the power supply plane, and the second ground terminal is connected to the ground plane.

11. A semiconductor package according to claim 5, further comprising:

a substrate on which the semiconductor package is mounted, the substrate having a power supply, a ground terminal, and differential signal terminals, wherein the power supply terminal of the semiconductor package is connected to the power supply of the substrate, the ground terminal of the semiconductor package is connected to the ground terminal of the substrate, and the pair of differential output terminals of the semiconductor package are connected to the differential signal terminals.

12. A semiconductor package according to any of claims 2 to 5, wherein the capacitance is a chip capacitor.

13. A semiconductor package according to any of claims 2 to 5, wherein the capacitance is a thick film capacitor formed on an inner layer or surface layer of a substrate of the semiconductor package.

14. A semiconductor package according to any of claims 2 to 5, wherein the inductance is an inductor formed of an interconnect of the semiconductor package.

15. A semiconductor package according to any of claims 2 to 5, wherein the inductance is a chip inductor.

16. A semiconductor package according to any of claims 2 to 5, further comprising a carrier substrate on which the semiconductor element, the capacitance, and the inductance are to be mounted, wherein the carrier substrate is a ceramic substrate or a resin multi-layer substrate.

17. A semiconductor package according to any of claims 2 to 5, wherein at least one terminal selected from the power supply terminal and the ground terminal of the semiconductor package is adjacent to the output terminal or the differential output terminals.

18. A semiconductor package according to any of claims 2 to 5, wherein the capacitance is a thin film capacitor formed on an inner layer or surface layer of a substrate of the semiconductor package.

* * * * *